(12) United States Patent
Oh

(10) Patent No.: US 8,476,124 B2
(45) Date of Patent: Jul. 2, 2013

(54) METHOD OF MANUFACTURING SEMICONDUCTOR DEVICE

(75) Inventor: Junji Oh, Yokohama (JP)

(73) Assignee: Fujitsu Semiconductor Limited, Yokohama (JP)

(*) Notice: Subject to any disclaimer, the term of this patent is extended or adjusted under 35 U.S.C. 154(b) by 125 days.

(21) Appl. No.: 13/176,052

(22) Filed: Jul. 5, 2011

(65) Prior Publication Data

US 2012/0083079 A1    Apr. 5, 2012

(30) Foreign Application Priority Data

Sep. 30, 2010  (JP) ................................ 2010-220775

(51) Int. Cl.
*H01L 21/336* (2006.01)
(52) U.S. Cl.
USPC ................................. 438/162; 257/E21.412
(58) Field of Classification Search
None
See application file for complete search history.

(56) References Cited

U.S. PATENT DOCUMENTS

| 6,426,279 | B1 | 7/2002 | Huster et al. | |
|---|---|---|---|---|
| 6,482,714 | B1 | 11/2002 | Hieda et al. | |
| 8,294,217 | B2 * | 10/2012 | Ema et al. | 257/368 |
| 2009/0108350 | A1 | 4/2009 | Cai et al. | |

OTHER PUBLICATIONS

A. Asenov et al., "Suppression of Random Dopant-Induced Threshold Voltage Fluctuations in Sub-0.1-μm MOSFET's with Epitaxial and δ-doped Channels", IEEE Transactions on Electron Devices, 1999, vol. 46, No. 8, pp. 1718-1724.
W. Lee, "MOS Device Structure Development for ULSI: Low Power/High Speed Operation", Microelectron. Reliab., 1997, vol. 37, No. 9, pp. 1309-1314.
A. Hokazono et al., "Steep Channel Profiles in n/pMOS Controlled by Boron-Doped Si:C Layers for Continual Bulk-CMOS Scaling", IEDM09-673-IEDM09-676.
L. Shao et al., "Boron diffusion in silicon: the anomalies and control by point defect engineering", Materials Science and Engineering, R 42, 2003, pp. 65-114.

* cited by examiner

*Primary Examiner* — Seahvosh Nikmanesh
(74) *Attorney, Agent, or Firm* — Westerman, Hattori, Daniels & Adrian, LLP

(57) ABSTRACT

The method of manufacturing the semiconductor device includes amorphizing a first region and a second region of a semiconductor substrate by an ion implantation, implanting a first impurity and a second impurity respectively in the first region and the second region, activating the implanted impurities to form a first impurity layer and a second impurity layer, epitaxially growing a semiconductor layer above the semiconductor substrate with the impurity layers formed on, growing a gate insulating film above the first region and the second region, and forming a first gate electrode above the gate insulating film in the first region and the second gate electrode above the gate insulating film in the second region.

14 Claims, 26 Drawing Sheets

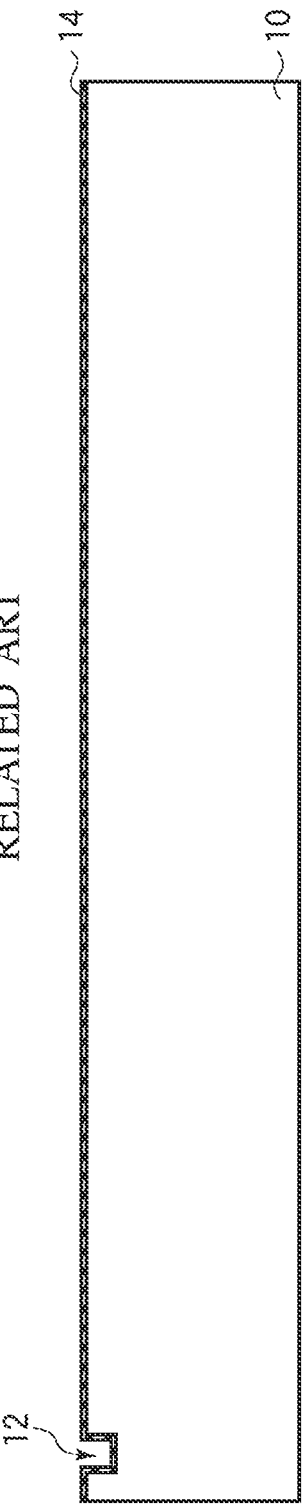
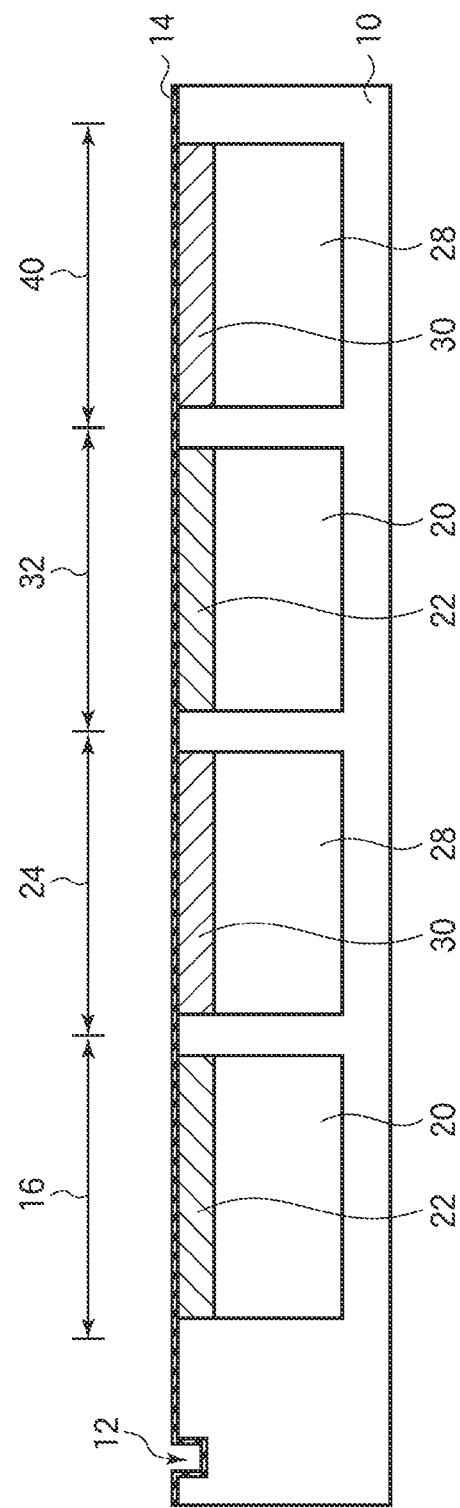
FIG. 21A
RELATED ART
FIG. 21B
RELATED ART

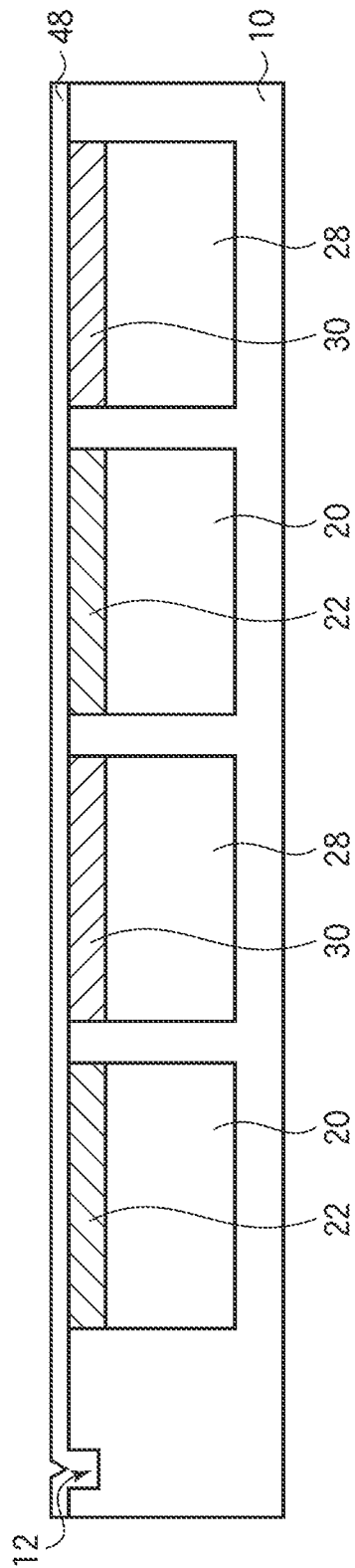
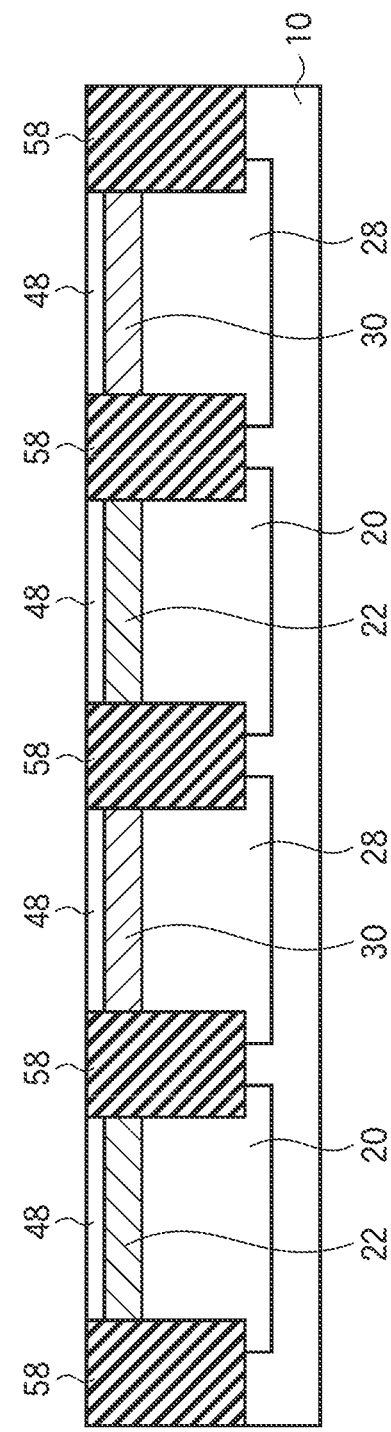

US 8,476,124 B2

METHOD OF MANUFACTURING SEMICONDUCTOR DEVICE

CROSS REFERENCE TO RELATED APPLICATIONS

This application is based upon and claims the benefit of priority of the prior Japanese Patent Application No. 2010-220775, filed on Sep. 30, 2010, the entire contents of which are incorporated herein by reference.

FIELD

The embodiments discussed herein are related to a method of manufacturing a semiconductor device.

BACKGROUND

As semiconductor devices are downsized and highly integrated, the fluctuations of the threshold voltages of the transistors due to statistical fluctuations of the channel impurity becomes conspicuous. The threshold voltage is one of important parameters for deciding the performance of the transistors, and to manufacture semiconductor device of high performance and high reliability, it is important to decrease the fluctuations of the threshold voltage due to the statistical fluctuations of the impurity.

As one technique of decreasing the fluctuations of the threshold voltage due to the statistical fluctuations is proposed the technique that a non-doped epitaxial silicon layer is formed on a highly doped channel impurity layer having a steep impurity concentration distribution.

The following are examples of related: U.S. Pat. No. 6,426,279; U.S. Pat. No. 6,482,714; U.S. Patent Publication No. 2009/0108350; A. Asenov, "Suppression of Random Dopant-Induced Threshold Voltage Fluctuations in Sub-0.1-µm MOSFET's with Epitaxial and δ-doped Channels", IEEE Transactions on Electron Devices, vol. 46, No. 8. p. 1718, 1999; Woo-Hyeong Lee, "MOS Device Structure Development for ULSI: Low Power/High Speed Operation", Microelectron. Reliab., Vol. 37, No. 9, pp. 1309-1314, 1997; A. Hokazono et al., "Steep Channel Profiles in n/pMOS Controlled by Boron-Doped Si:C Layers for Continual Bulk-CMOS Scaling", IEDM09-673; and L. Shao et al., "Boron diffusion in silicon: the anomalies and control by point defect engineering", Materials Science and Engineering R 42, pp. 65-114, 2003.

In order to decrease the fluctuations of the threshold voltage due to the statistic fluctuation of an impurity, it is important to form a channel impurity layer having a steep impurity concentration distribution and how to suppress the diffusion of the impurity toward the epitaxial layer.

SUMMARY

According to one aspect of an embodiment, there is provided a method of manufacturing a semiconductor device including amorphizing a first region and a second region of a semiconductor substrate by an ion implantation into the semiconductor substrate, ion implanting a first impurity of a first conduction type in the first region of the semiconductor substrate, ion implanting a second impurity of the second conduction type in the second region of the semiconductor substrate, activating the first impurity and the second impurity to form a first impurity layer in the first region and a second impurity layer in the second region, epitaxially growing a semiconductor layer above the semiconductor substrate with the first impurity layer and the second impurity layer formed in, forming a gate insulating film above the semiconductor layer in the first region and the second region, and forming a first gate electrode above the first gate insulating film in the first region and a second gate electrode above the first gate insulating film in the second region.

The object and advantages of the embodiment will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF DRAWINGS

FIGS. 21A-21B, 22A-22B, 23A-23B, 24A-24B, 25A-25B and 26 are sectional views illustrating a method of manufacturing the semiconductor device according to a reference example.

DESCRIPTION OF EMBODIMENTS

An Embodiment

A semiconductor device and a method of manufacturing a semiconductor device according to an embodiment will be described with reference to FIGS. 1 to 20.

Figure 1:
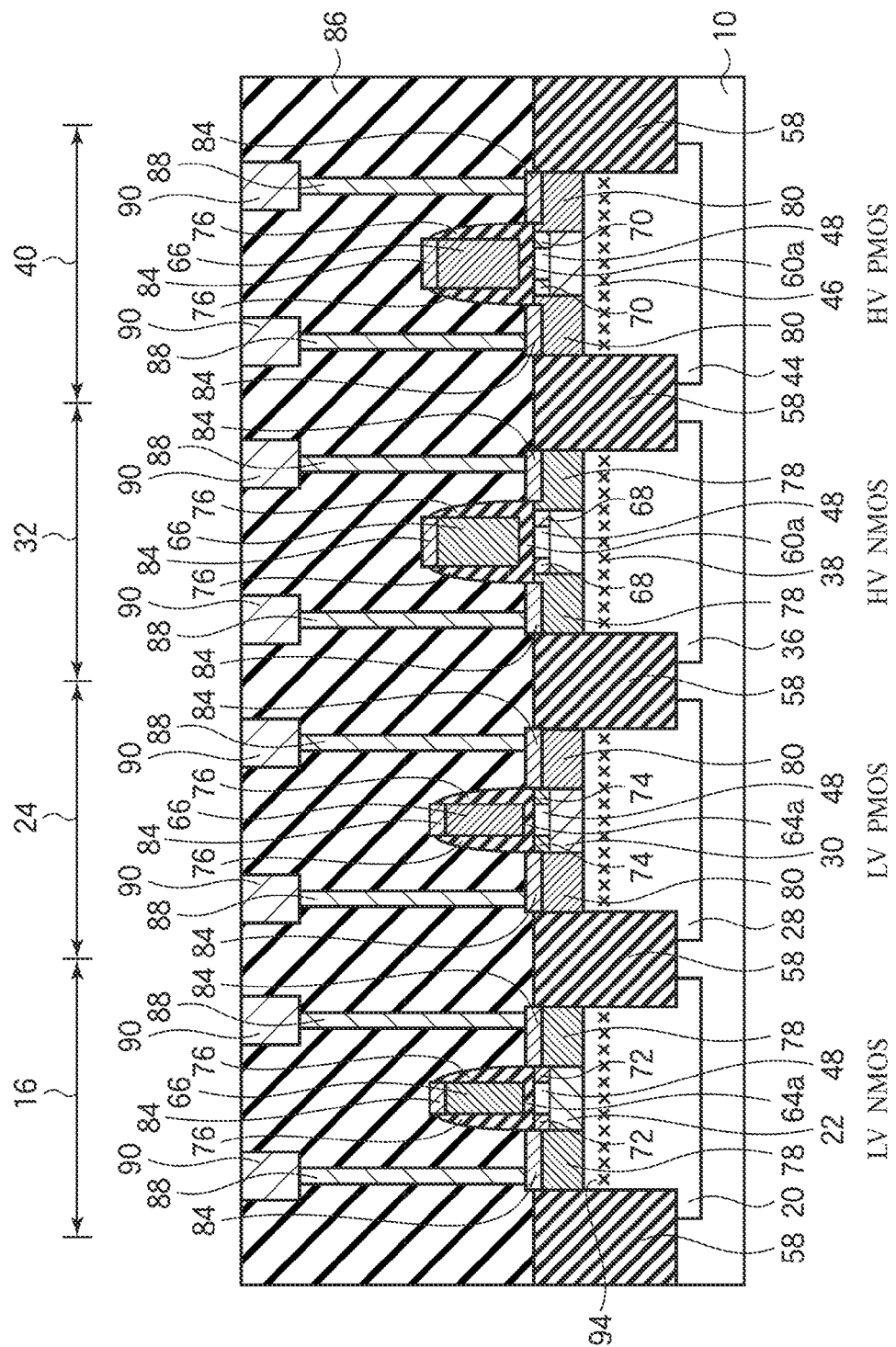
FIGS. 1 and 2 are diagrammatic sectional views illustrating a structure of a semiconductor device according to an embodiment.
Figure 2:
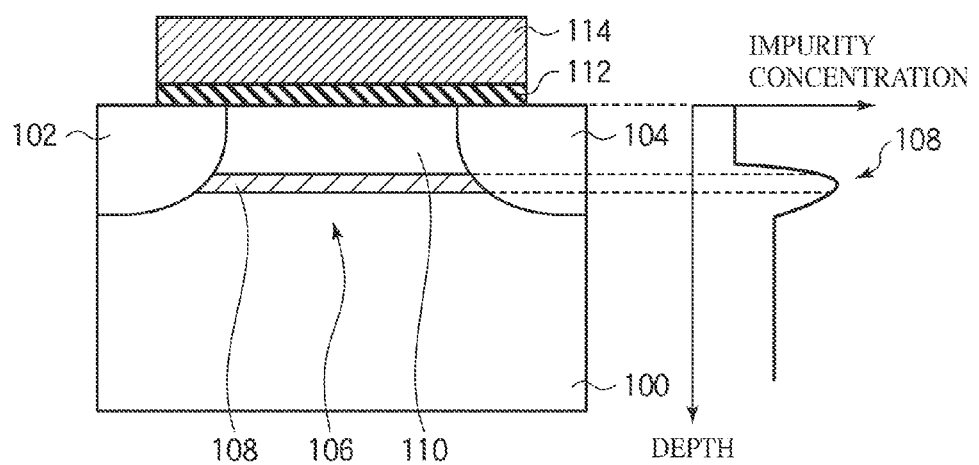

FIGS. 1 and 2 are diagrammatic sectional views illustrating a structure of the semiconductor device according to the present embodiment. FIGS. 3-20 are sectional views illustrating a method of manufacturing the semiconductor device according to the present embodiment.

First, the structure of the semiconductor device according to the present embodiment will be described with reference to FIGS. 1 and 2.

Above a silicon substrate 10, a low-voltage NMOS transistor (LV NMOS) and a low-voltage PMOS transistor (LV PMOS), a high-voltage NMOS transistor (HV NMOS) and a high-voltage PMOS transistor (HV PMOS) are formed. The low voltage transistors are used mainly in the circuit units which require high-speed operation. The high voltage transistors are used in circuit units, such as a 3.3 V I/O, etc., high voltages are applied to.

The low-voltage NMOS transistor (LV NMOS) is formed in a low-voltage NMOS transistor forming region 16 of the silicon substrate 10.

In the silicon substrate 10 in the low-voltage NMOS transistor forming region 16, a p-well 20 and a p-type highly doped impurity layer 22 are formed. Above the p-type highly doped impurity layer 22, a silicon layer 48 epitaxially grown on the silicon substrate 10 is formed. Above the silicon layer 48, a gate insulating film 64a is formed. Above the gate insulating film 64a, a gate electrode 66 is formed. In the silicon layer 48 and the silicon substrate 10 on both sides of a gate electrode 66, source/drain regions 78 are formed. Thus, the low-voltage NMOS transistor (LV NMOS) is formed.

The low-voltage PMOS (LV PMOS) is formed in the low-voltage PMOS transistor forming region 24 of the silicon substrate 10.

In the silicon substrate 10 in the low-voltage PMOS transistor forming region 24, an n-well 28 and an n-type highly doped impurity layer 30 are formed. Above the n-type highly doped impurity layer 30, a silicon layer 48 epitaxially grown on the silicon substrate 10 is formed. Above the silicon layer 48, a gate insulating film 64a is formed. Above the gate insulating film 64a, a gate electrode 66 is formed. In the silicon layer 48 and the silicon substrate 10 on both sides of the gate electrode 66, source/drain regions 80 are formed. Thus, the low-voltage PMOS transistor (LV PMOS) is formed.

The high voltage NMOS transistor (HV NMOS) is formed in a high voltage NMOS transistor forming region 32 of the silicon substrate 10.

In the silicon substrate 10 in the high voltage NMOS transistor forming region 32, a p-well 36 and a p-type impurity layer 38 are formed. To improve the junction breakdown voltage, the p-type impurity layer 38 has a lower concentration and a gradual impurity distribution than the p-type highly doped impurity layer 22 of the low voltage NMOS transistor. Above the p-type impurity layer 38, a silicon layer 48 epitaxially grown on the silicon substrate 10 is formed. Above the silicon layer 48, a gate insulating film 60a thicker than the gate insulating films 64a of the low voltage transistors is formed. Above the gate insulating film 60a, a gate electrode 66 is formed. In the silicon layer 48 and the silicon substrate 10 on both sides of the gate electrode 66, source/drain regions 78 are formed. Thus, the high voltage NMOS transistor (HV NMOS) is formed.

A high voltage PMOS transistor (HV PMOS) is formed in a high voltage PMOS transistor forming region 40 of the silicon substrate 10.

In the silicon substrate 10 in the high voltage PMOS transistor forming region 40, an n-well 44 and an n-type impurity layer 46 are formed. To improve the junction breakdown voltage, the n-type impurity layer 46 has a lower concentration and a gradual impurity distribution than the n-type highly doped impurity layer 30 of the low voltage PMOS transistor. Above the n-type impurity layer 46, a silicon layer 48 epitaxially grown on the silicon substrate 10 is formed. Above the silicon layer 48, a gate insulating film 60a thicker than the gate insulating films 64a of the low voltage transistors is formed. Above the gate insulating film 60a, a gate electrode 66 is formed. In the silicon layer 48 and the silicon substrate 10 on both sides of the gate electrode 66, source/drain regions 80 are formed. Thus, the high voltage PMOS transistor (HV PMOS) is formed.

Above the gate electrodes 66 and the source/drain regions 78, 80 of the respective transistors, a metal silicide film 84 is formed.

Above the silicon substrate 10 with the transistors of the four kinds formed on, an inter-layer insulating film 86 is formed. In the inter-layer insulating film 86, contact plugs 88 connected to the transistors are buried. To the contact plugs 88, interconnections 90 are connected.

As described above, the semiconductor device according to the present embodiment includes two kinds of low voltage transistors and two kinds of high voltage transistors.

As exemplified in FIG. 2, the low voltage transistors each include in the channel region 106, a highly doped impurity layer 108 having a steep impurity concentration distribution, and a non-doped silicon layer 110 epitaxially grown on the highly doped impurity layer 108. Such transistor structure is effective to suppress the threshold voltage fluctuations of the transistors due to the statistical fluctuations of the impurity. To suppress the fluctuations of the threshold voltage, it is important that the impurity concentration distribution of the highly doped impurity layer 108 is steep.

To realize the steep impurity concentration distribution, in the highly doped impurity layer 22 of the low voltage NMOS transistor, boron as the acceptor impurity, and carbon for preventing the diffusion of the boron are implanted. In the highly doped impurity layer of the low voltage PMOS transistor, arsenic or antimony, whose diffusion constant is low, is implanted as the donor impurity.

On the other hand, when the impurity layer 46 of the high voltage NMOS transistor and the impurity layer 46 of the high voltage PMOS transistor are highly doped and have steep impurity distributions, the junction breakdown voltage and the hot carrier immunity are lowered. Accordingly, in the impurity layer 38 of the high voltage NMOS transistor, boron is implanted as the acceptor impurity, but carbon, which has the diffusion preventing function, is not implanted. In the impurity layer 46 of the high voltage PMOS transistor, phosphorus, whose diffusion constant is larger than arsenic and antimony, is implanted. Thus, the impurity layer 38 and the impurity layer 46 have lower concentrations and gradual impurity concentration distributions in comparison with the p-type highly doped impurity layer 22 and the n-type highly doped impurity layer 30.

Crystal defects 94 are often formed all over a location inside the silicon substrate 10 deeper than the source/drain regions 78, 80 of the respective transistor forming regions (see FIG. 1). The crystal defects 94 have been formed when the amorphized silicon substrate 10 was recrystallized. The crystal defects 94 formed upon the recrystallization produces the effect of decreasing impurities in the active regions by gettering while being a cause to increase the leakage current when they are located near the p-n junctions. In view of this, the process conditions are so set that the crystal defects 94 are located deeper than the source/drain regions 78, 80.

Next, the method of manufacturing the semiconductor device according to the present embodiment will be described with reference to FIGS. 3 to 20.

First, by photolithography and etching, a trench to be used as the mark for the mask alignment is formed in a region other than the product to be formed region of the silicon substrate 10 (e.g., a scribe region).

In the method of manufacturing the semiconductor device according to the present embodiment, before device isolation insulating film 58 is formed, the wells and the channel impurity layers are formed. The trench 12 is used as the mark for the mask alignment in the lithography process made before the device isolation insulating film 58 is formed (e.g., the lithography process for forming the wells and the channel impurity layers).

The wells and the channel impurity layers are formed before the device isolation insulating films 58 are formed so as to suppress the film thickness decrease of the device isolation insulating film 58 in removing the silicon oxide films 14, 52, 60.

Figure 3:
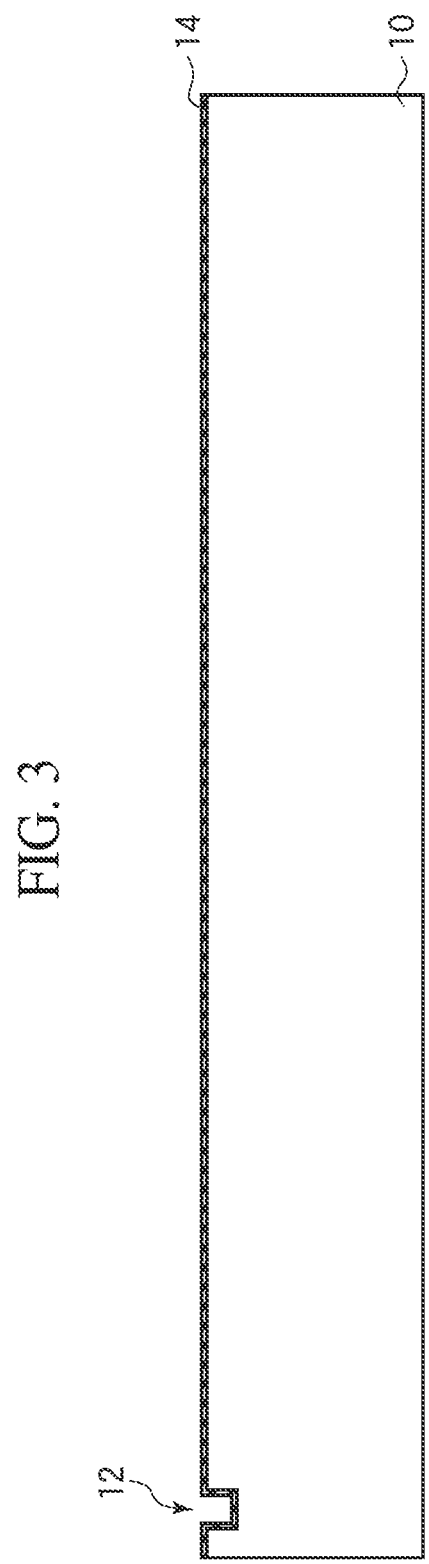
FIGS. 3-20 are sectional views illustrating a method of manufacturing the semiconductor device according to the embodiment.

Next, above the entire surface of the silicon substrate 10, a silicon oxide film 14 as the protection film of the surface of the silicon substrate 10 is formed by, e.g., thermal oxidation method (FIG. 3). The silicon oxide film 14 may be a chemical oxide film formed by chemical treatment.

Figure 4:
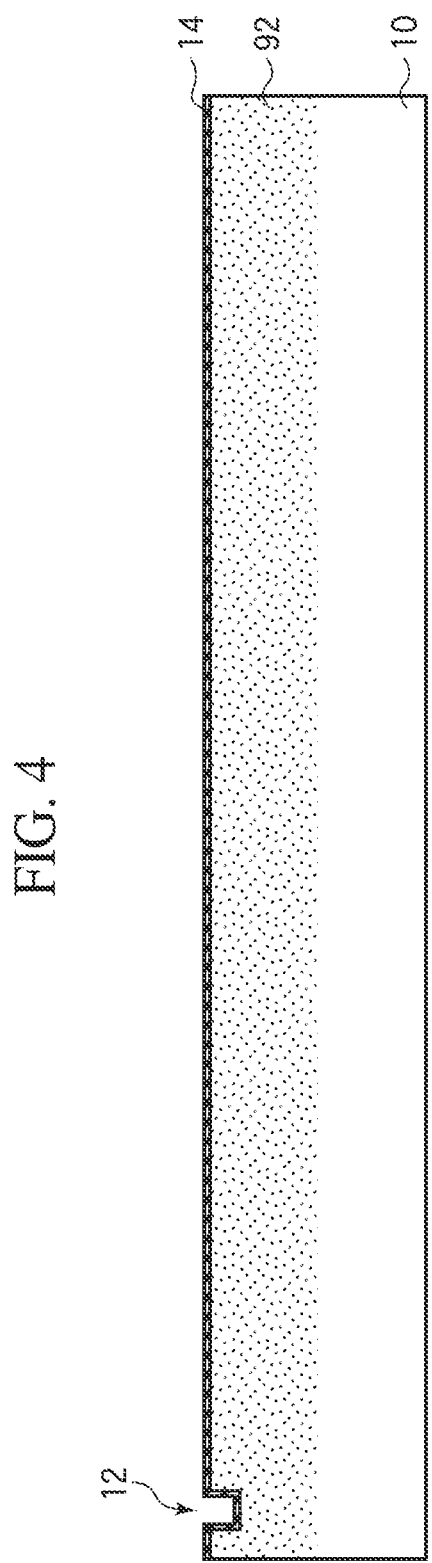

Then, ion implantation is made in the entire surface of the silicon substrate 10 without using a photoresist film to form an amorphous layer 92 in the surface region of the silicon substrate (FIG. 4). For example, germanium ions ($Ge^+$) are implanted under the conditions of 50 keV acceleration energy and a $5\times10^{14}$ $cm^{-2}$ dose to form the amorphous layer 92.

The amorphous layer 92 is formed so that the interface between the amorphous layer 92 and the single crystal silicon (the bottoms of the amorphous layer 92) is positioned deeper than the source/drain regions 78, 80. The depth of the amorphous layer 92 to be formed can be set by the acceleration energy of the ions to be implanted. The dose is set at a quantity necessary to make the silicon substrate 10 amorphous. For germanium, the dose is set at not less than about $1 \times 10^{14}$ cm$^{-2}$.

The ion species for forming the amorphous layer is not limited to germanium. For example, ions of silicon, argon, xenon, etc. can be used. When these ion species are used, the acceleration energy and the dose may be set in the same way.

For example, to form by silicon ion implantation the amorphous layer 92 equivalent to that formed by the germanium ion implantation described above, the acceleration energy can be set at 27 keV, and the dose can be set at $1.1 \times 10^{15}$ cm$^{-2}$.

Next, by photolithography, a photoresist film 42 exposing the high voltage PMOS transistor forming region and covering the reset region is formed. For the alignment for the photolithography, the trench 12 is used as the alignment mark.

Figure 5:
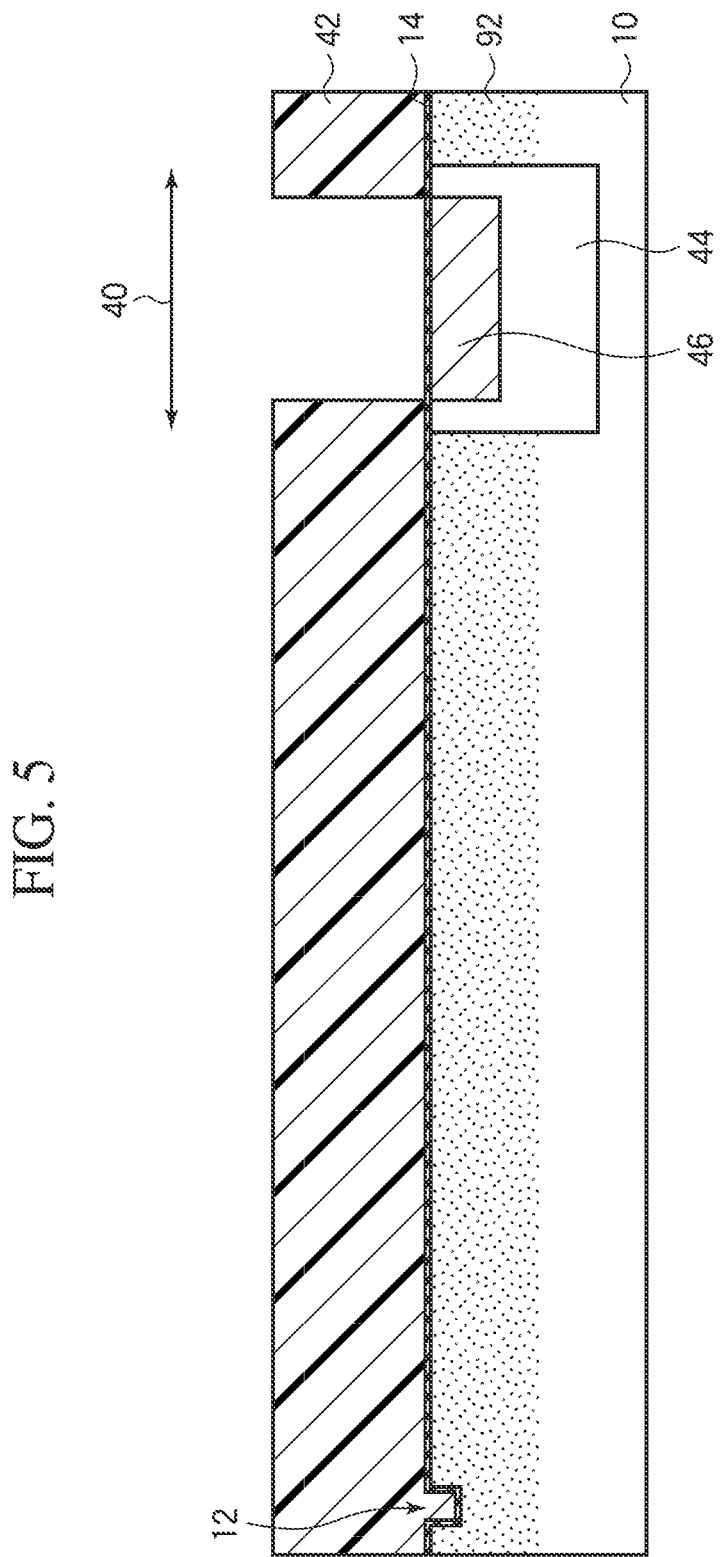

Next, with the photoresist film 42 as the mask, ion implantation is made to form an n-well 44 and an n-type impurity layer 46 in the high voltage PMOS transistor forming region 40 of the silicon substrate 10 (FIG. 5).

The n-well 44 is formed, e.g., by implanting respectively in 4 directions tilted to the normal direction of the substrate phosphorus ions (P$^+$) at 360 keV acceleration energy and $7.5 \times 10^{12}$ cm$^{-2}$ dose. The n-type impurity layer 46 is formed, e.g., by implanting phosphorus ions at 30 keV acceleration energy and $3 \times 10^{12}$ cm$^{-2}$ dose. In the high voltage PMOS transistor, in view of making the impurity concentration distribution of the channel region gradual to thereby improve the junction breakdown voltage and hot carrier immunity, phosphorus in place of arsenic or antimony is ion implanted.

The amorphous layer 92 formed by the germanium ion implantation has the effect of preventing the channeling of the implanted ions.

Next, by wet etching with, e.g., the mixture liquid of sulfuric acid (H$_2$SO$_4$) and hydrogen peroxide liquid (H$_2$O$_2$), the photoresist film 42 is removed.

Then, by photolithography, a photoresist film 34 exposing the high voltage NMOS transistor forming region and covering the rest region is formed. For the alignment for the photolithography, the trench 12 is used as the alignment mark.

Figure 6:
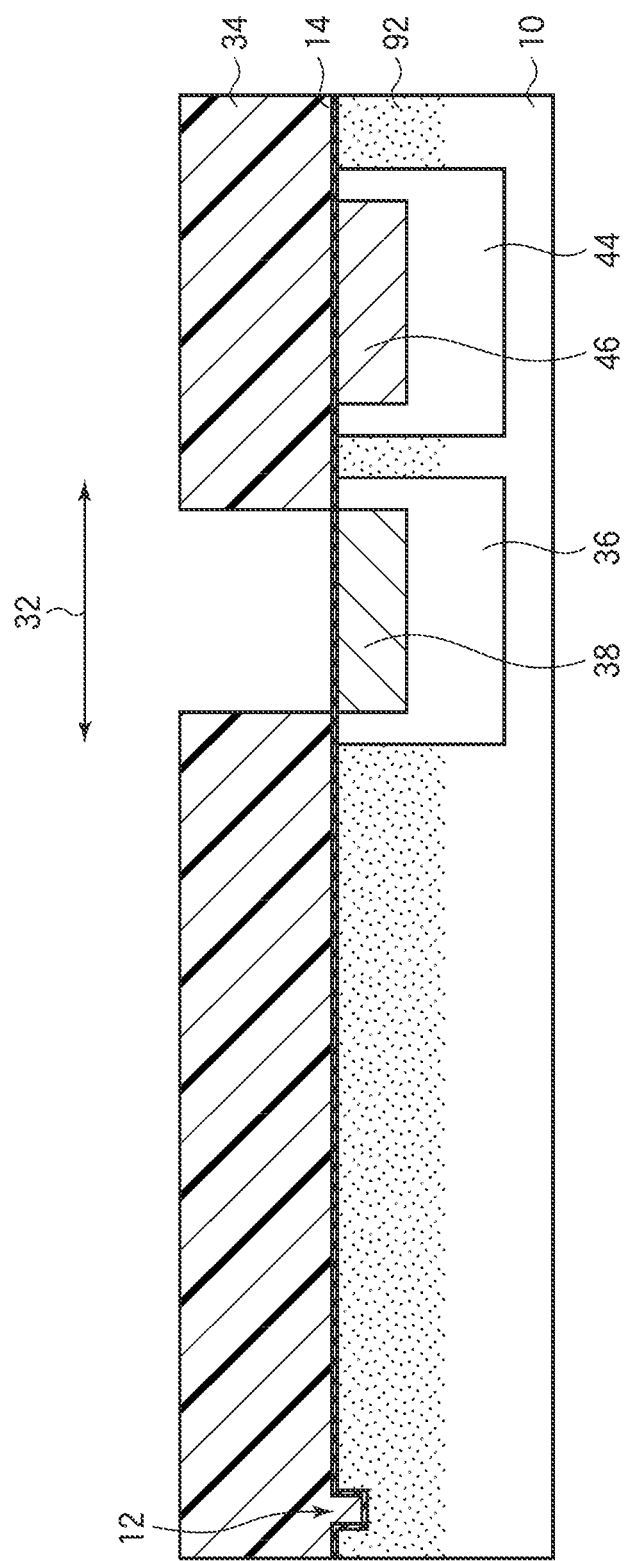

Next, with the photoresist film 34 as the mask, ion implantation is made to form a p-well 36 and a p-type impurity layer 38 in the high voltage NMOS transistor forming region 32 of the silicon substrate 10 (FIG. 6).

The p-well 36 is formed, e.g., by implanting respectively in 4 directions tilted to the normal direction of the substrate boron ions (B$^+$) under the conditions of 150 keV acceleration energy and $7.5 \times 10^{12}$ cm$^{-2}$ dose. The p-type impurity layer 38 is formed, e.g., by implanting boron ions under the conditions of 15 keV acceleration energy and $3 \times 10^{12}$ cm$^{-2}$ dose. In the high voltage NMOS transistor, in view of making the impurity concentration distribution of the channel region gradual to thereby improve the junction breakdown voltage and the hot carrier immunity, carbon ions are not implanted.

The amorphous layer 92 formed by the germanium ion implantation has the effect of preventing the channeling of the implanted ions.

Next, by wet etching with, e.g., the mixture liquid of sulfuric acid and hydrogen peroxide liquid, the photoresist film 34 is removed.

Then, by photolithography, a photoresist film 26 exposing the low voltage PMOS transistor forming region and covering the rest region is formed. For the alignment for the photolithography, the trench 12 is used as the alignment mark.

Figure 7:
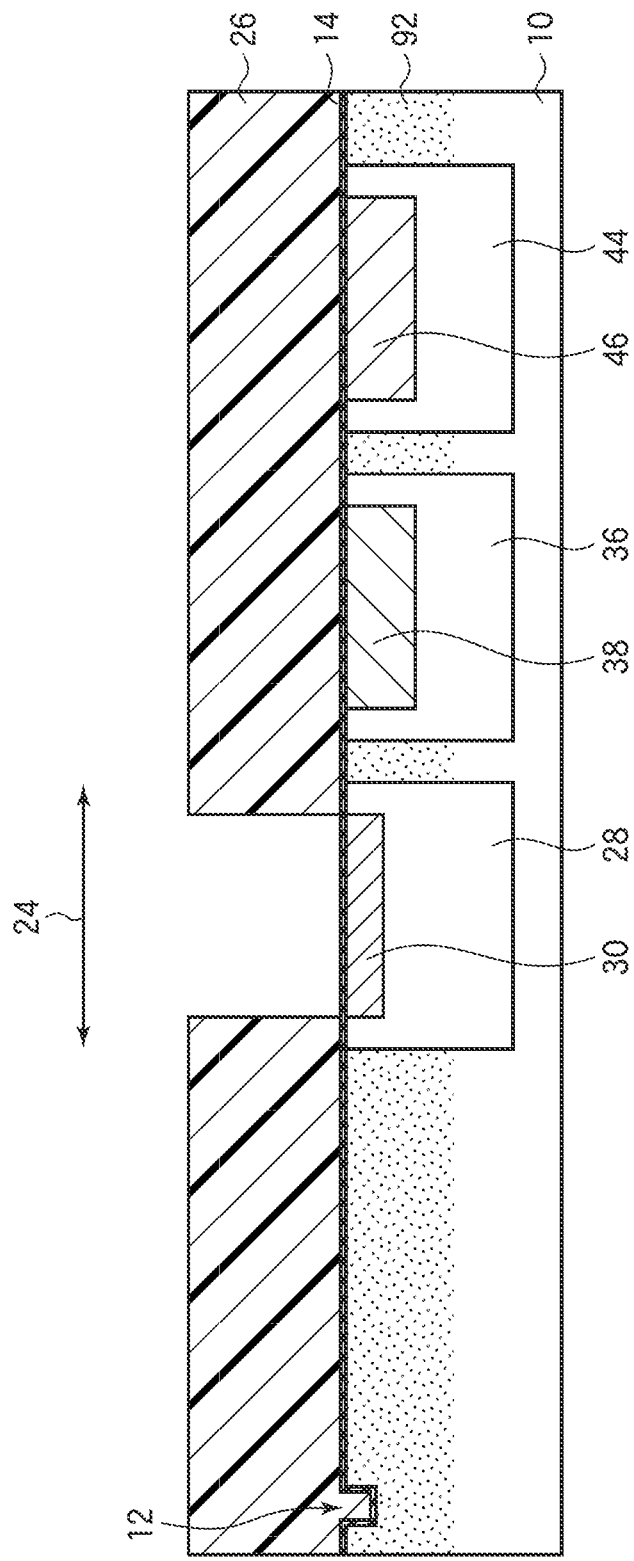

Next, with the photoresist film 26 as the mask, ion implantation is made to form an n-well 28 and an n-type highly doped impurity layer 30 are formed in the low voltage PMOS transistor forming region 24 of the silicon substrate 10 (FIG. 7).

The n-well 28 is formed, e.g., by implanting respectively in 4 directions tilted to the normal direction of the substrate phosphorus ions under the conditions of 360 keV acceleration energy and $7.5 \times 10^{12}$ cm$^{-2}$ dose. The n-type highly doped impurity layer 30 is formed, e.g., by implanting arsenic ions (As$^+$) under the conditions of 6 keV acceleration energy and $2 \times 10^{13}$ cm$^{-2}$ dose, or antimony ions (Sb$^+$) under the conditions of 20 keV-50 keV acceleration energy (e.g., 20 keV) and $0.5 \times 10^{13}$ cm$^{-2}$-$2.0 \times 10^{13}$ cm$^{-2}$ dose (e.g., $1.5 \times 10^{13}$ cm$^{-2}$).

The amorphous layer 92 formed by the germanium ion implantation has the effect of preventing the channeling of the implanted ions.

Next, by wet etching with, e.g., the mixture liquid of sulfuric acid and hydrogen peroxide liquid, the photoresist film 26 is removed.

Next, by photolithography, a photoresist film 18 exposing the low voltage NMOS transistor forming region and covering the rest region is formed. For the alignment for the photolithography, the trench 12 is used as the alignment mark.

Figure 8:
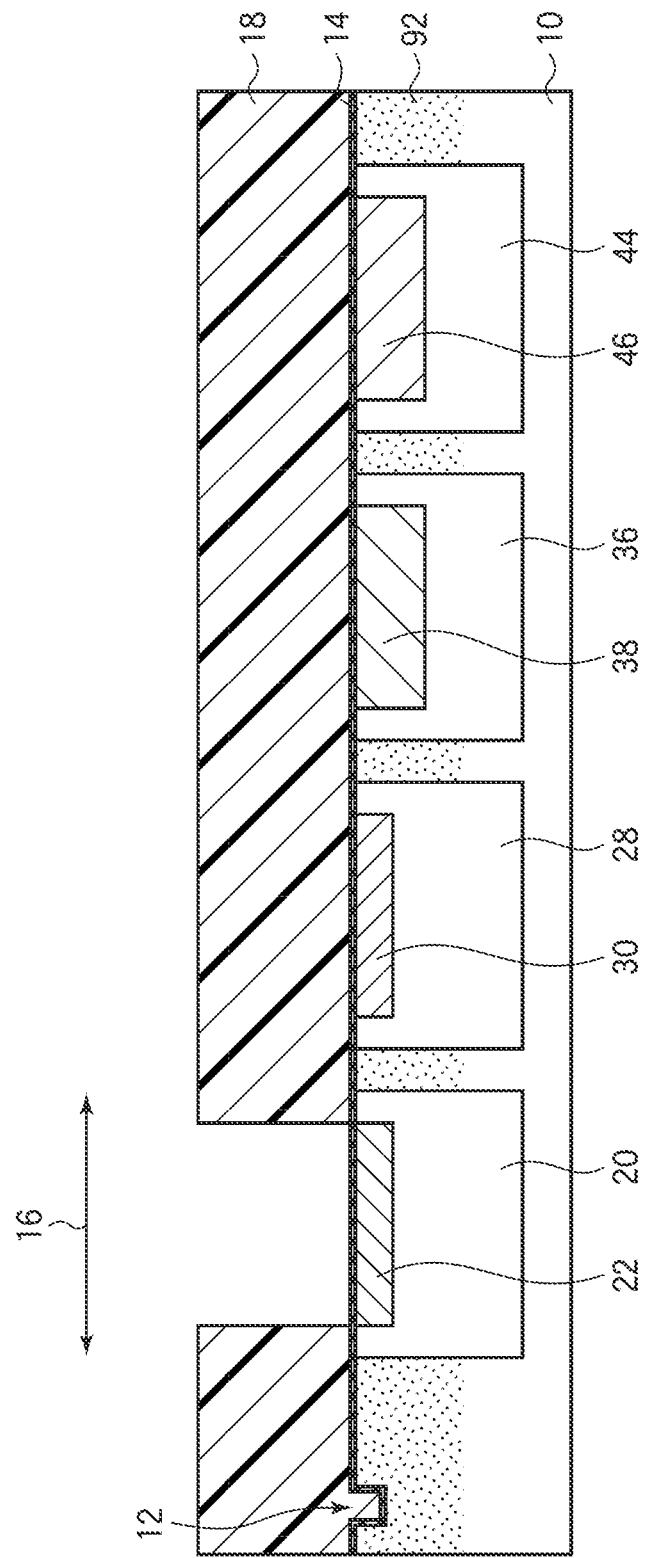

Next, ion implantation is made with the photoresist film 18 as the mask to form a p-well 20 and a p-type highly doped impurity layer 22 in the low voltage NMOS transistor forming region 16 (FIG. 8).

The p-well 20 is formed, e.g., by implanting boron ions respectively in 4 directions tilted to the normal direction of the substrate under the conditions of 150 keV acceleration energy and $7.5 \times 10^{12}$ cm$^{-2}$ dose. The p-type highly doped impurity layer 22 is formed, e.g., by respectively implanting carbon ions (C$^+$) under the conditions of 3 keV acceleration energy and $3 \times 10^{14}$ cm$^{-2}$ and boron ions (B$^+$) under the conditions of 2 keV acceleration energy and $3 \times 10^{13}$ cm$^{-2}$.

By the step of implanting germanium ions illustrated in FIG. 4, the amorphous layer 92 is formed in the surface region of the silicon substrate 10. This amorphous layer 92 acts to prevent the channeling of the boron ions while increasing the probability of positioning the carbon at the lattice points. The carbon positioned at the lattice points acts to suppress the diffusion of the boron.

Next, by wet etching with, e.g., the mixture liquid of sulfuric acid and hydrogen peroxide liquid, the photoresist film 18 is removed.

In the present embodiment, the ion implantation for forming the amorphous layer 92 is made in the entire surface of the silicon substrate 10 without a mask and is not made with the photoresist film 18 as the mask. Accordingly, the inconvenience, etc. that the photoresist film 18 is deformed by the ion implantation for the amorphization and becomes difficult to be removed are not caused.

Next, thermal processing is made in an inert ambient atmosphere to recover ion implantation damages introduced in the silicon substrate 10 while activating the implanted impurities. For example, the thermal processing is made in nitrogen ambient atmosphere on two stages of 600° C. and 150 seconds and 1000° C. and 0 second.

In recrystallizing the amorphous layer 92, often crystal defects 94 are formed near the interface between the amorphous layer 92 and the single crystal silicon. In an example that the ion implantation for the amorphization is made under the above-described conditions, crystal defects 94 are formed at the depth of about 100 nm from the interface between the silicon substrate 10 and the silicon layer 48.

Then, by wet etching with, e.g., hydrofluoric acid aqueous solution, the silicon oxide film 14 is removed.

Figure 9:
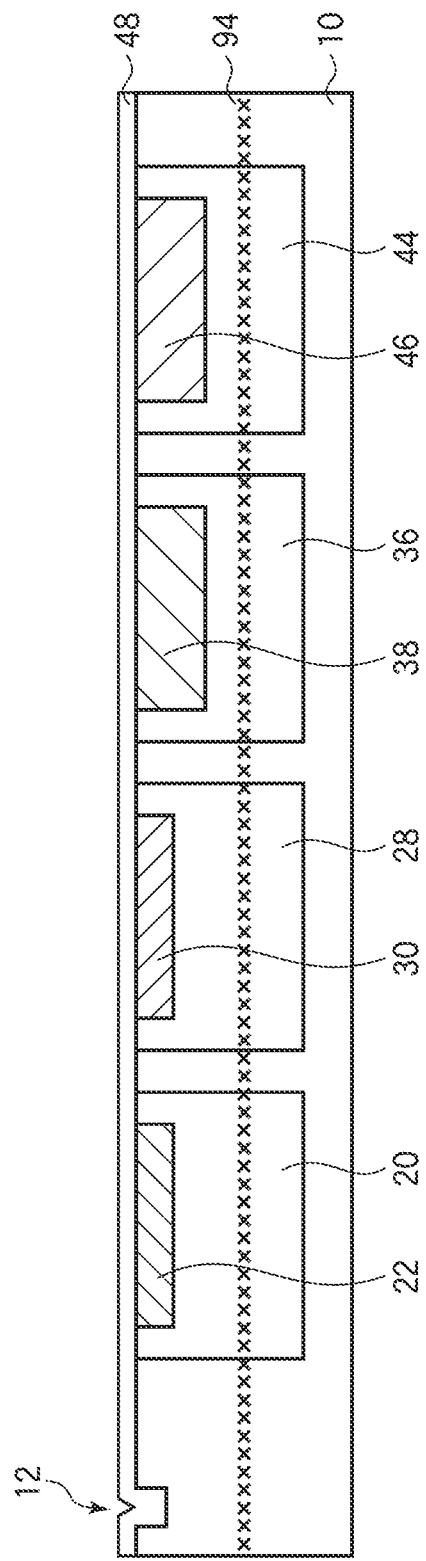

Next, by, e.g., CVD method, a non-doped silicon layer 48 of, e.g., a 30 nm-thickness is grown on the surface of the silicon substrate 10 (FIG. 9).

Next, by, e.g., ISSG (In-Situ Steam Generation) method, the surface of the silicon layer 48 is wet oxidized under a reduced pressure to form a silicon oxide film 52 of, e.g., a 3 nm-thickness. As the processing conditions, for example, the temperature is set at 810° C., and the processing period of time is set at 20 seconds.

Then, above the silicon oxide film 52, a silicon nitride film 54 of, e.g., a 70 nm-thickness is deposited by, e.g., LPCVD method. As the processing conditions, for example, the temperature is set at 700° C., and the processing period of time is set at 60 minutes.

Figure 10:
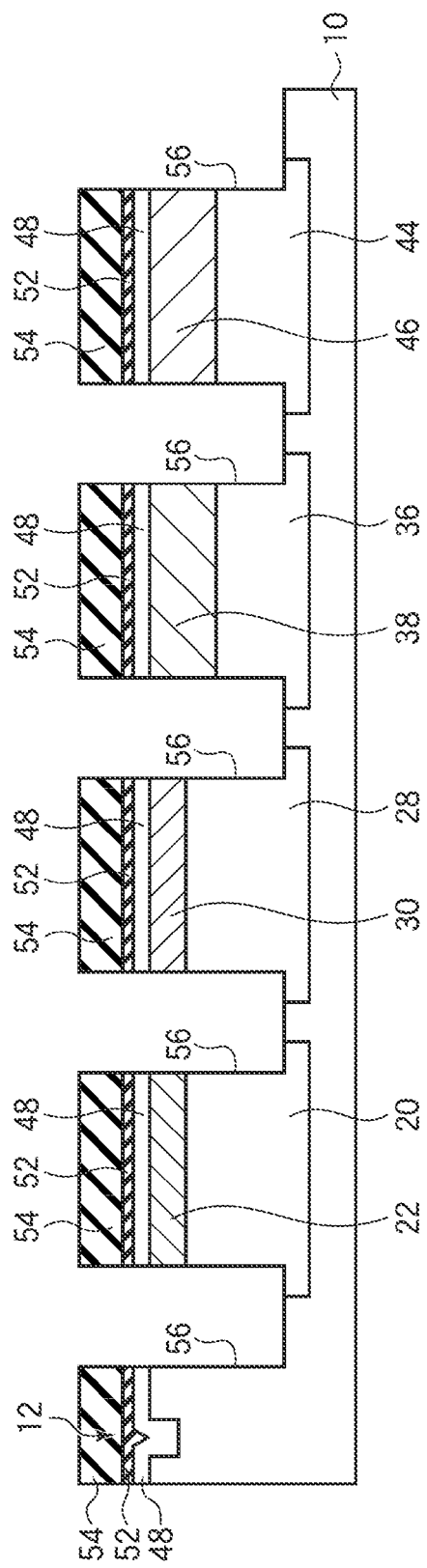

Next, by photolithography and dry etching, the silicon nitride film 54, the silicon oxide film 52, the silicon layer 48 and the silicon substrate 10 are anisotropically etched to form a device isolation trench 56 in the device isolation region containing the regions between the respective transistor forming regions (FIG. 10). For the alignment for the photolithography, the trench 12 is used as the alignment mark.

Next, by, e.g., ISSG method, the surface of the silicon layer 48 and the silicon substrate 10 are wet oxidized under a decreased pressure to form a silicon oxide film of, e.g., a 2 nm-thickness as the liner film on the inside walls of the device isolation trench 56. As the processing conditions, for example, the temperature is set at 810° C., and the processing period of time is set at 12 seconds.

Next, by, e.g., high density plasma CVD method, a silicon oxide film of, e.g., a 500 nm-thickness is deposited to fill the device isolation trench 56 by the silicon oxide film.

Figure 11:
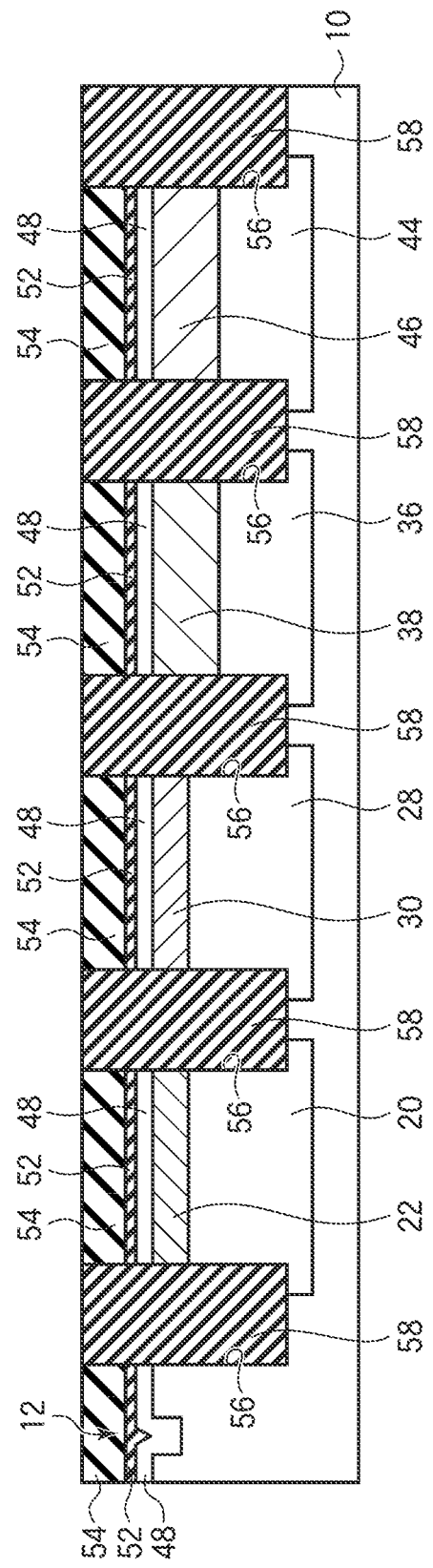

Then, by, e.g., CMP method, the silicon oxide film above the silicon nitride film 54 is removed. Thus, by the so-called STI (Shallow Trench Isolation) method, the device isolation insulating film 58 of the silicon oxide film buried in the device isolation trench 56 is formed (FIG. 11).

Next, by, e.g., wet etching with hydrofluoric acid aqueous solution and with the silicon nitride film 54 as the mask, the device isolation insulating film 58 is etched by, e.g., about 30 nm. This etching is for adjusting the surface of the silicon layer 48 of the completed transistors and the surface of the device isolation insulating film 58 to be on the substantially the same height.

Figure 12:
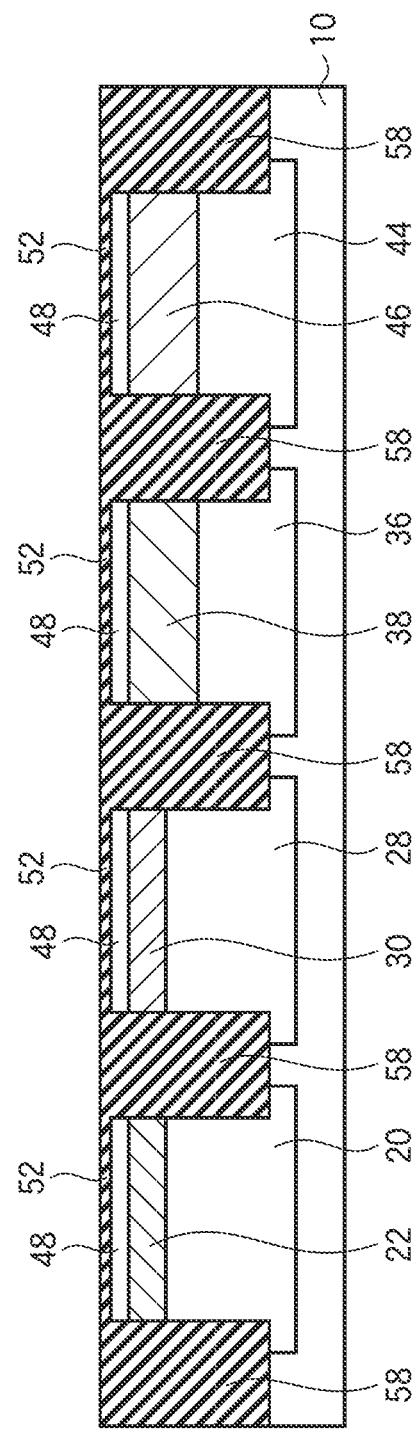

Next, by, e.g., wet etching with hot phosphoric acid, the silicon nitride film 54 is removed (FIG. 12).

Next, by wet etching using, e.g., hydrofluoric acid aqueous solution, the silicon oxide film 52 is removed. At this time, to completely remove the silicon oxide film 52, the 3 nm-film thickness silicon oxide film 52 is etched by a film thickness equivalent to a 5 nm-thickness of thermal oxidation film.

For the silicon oxide film of the device isolation insulating film 58, which has been deposited by high density plasma CVD method, the etching rate to hydrofluoric acid aqueous solution is about twice the etching rate for thermal oxidation film. If impurity ions are implanted in the silicon oxide film, although depending on an ionic species, the etching rate is further increased. High temperature thermal processing can lower the etching rate but is not preferable so as to realize steep channel impurity distributions.

In the present embodiment, in which no impurity ions are implanted in the silicon oxide film forming the device isolation insulating film 58, the etching amount of the device isolation insulating film 58 accompanying the etching of the silicon oxide film 52 can be suppressed to be as small as 10 nm.

Figure 13:
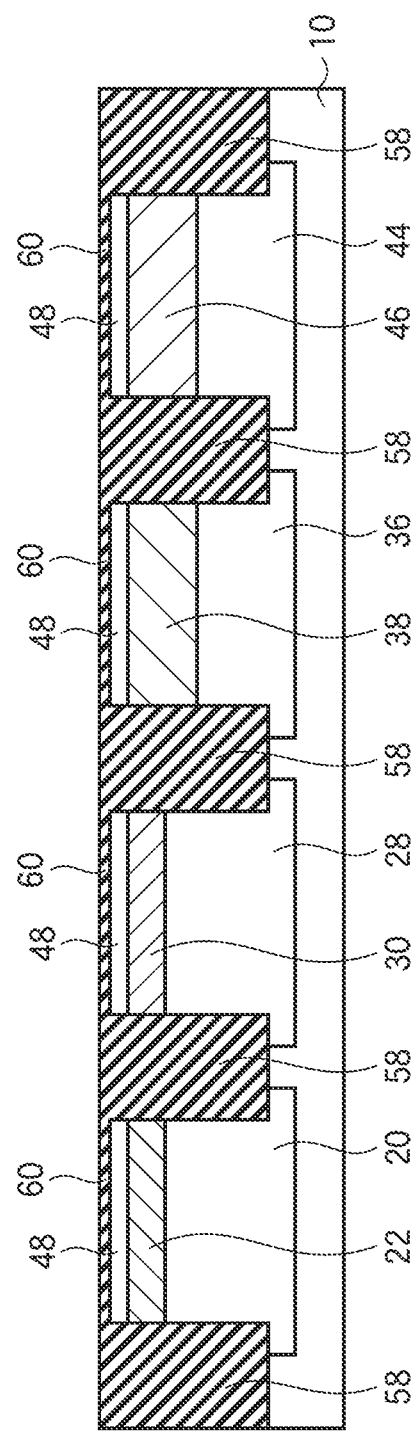

Next, by thermal oxidation method, a silicon oxide film 60 of, e.g., a 7 nm-thickness is formed (FIG. 13). As the processing conditions, for example, the temperature is set at 750° C., and the processing period of time is set at 52 minutes.

Next, by photolithography, a photoresist film 62 covering the high voltage NMOS transistor forming region 32 and the high voltage PMOS transistor forming region 40 and exposing the reset region is formed.

Figure 14:
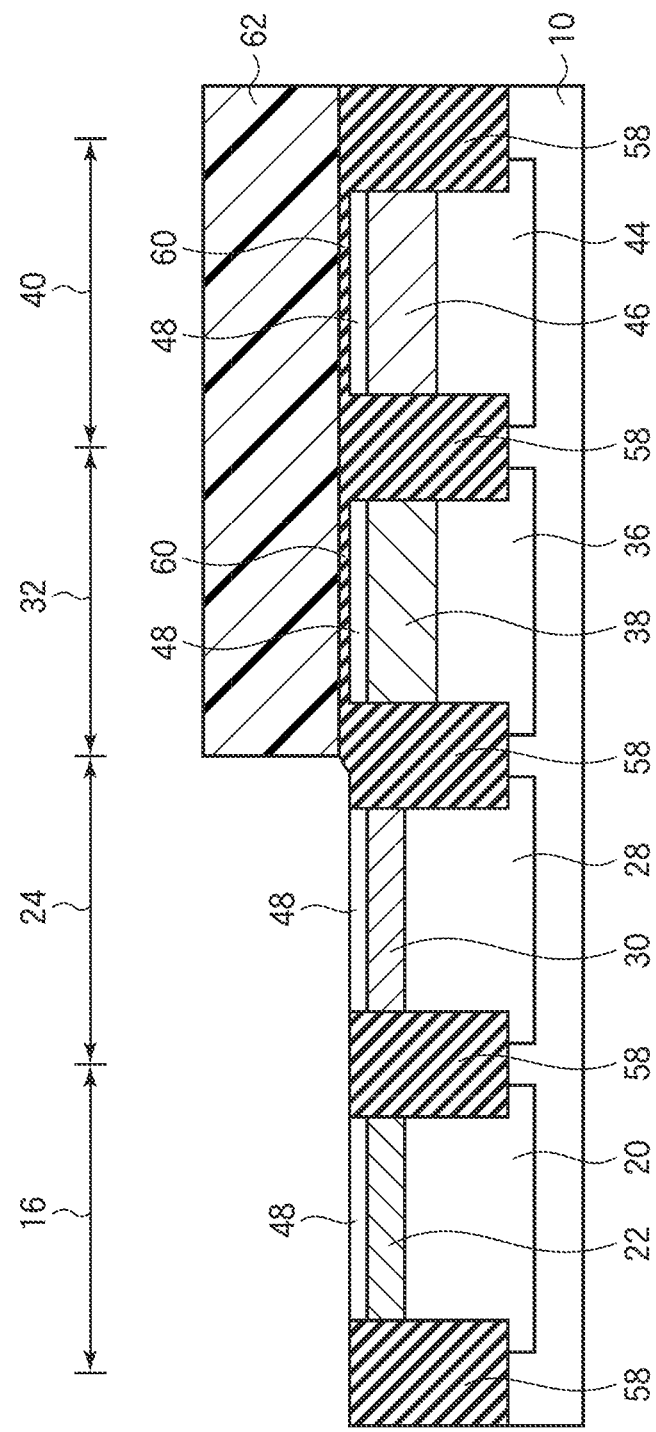

Then, by, e.g., wet etching with hydrofluoric acid aqueous solution and with the photoresist film 62 as the mask, the silicon oxide film 60 is etched. Thus, the silicon oxide film 60 in the low voltage NMOS transistor forming region 16 and the low voltage PMOS transistor forming region 24 is removed (FIG. 14). At this time, to completely remove the silicon oxide film 60, the 7 nm-thickness silicon oxide film 60 is etched by a film thickness equivalent to a 10 nm-thickness of thermal oxidation film.

For the silicon oxide film of the device isolation insulating film 58, which has been deposited by high density plasma CVD method, the etching rate to hydrofluoric acid aqueous solution is about twice the etching rate for thermal oxidation film. If impurity ions are implanted in the silicon oxide film, although depending on an ionic species, the etching rate is further increased. High temperature thermal process can lower the etching rate but is not preferable so as to realize steep channel impurity distributions.

In the present embodiment, in which no impurity ions are implanted in the silicon oxide film forming the device isolation insulating film 58, the etching amount of the device isolation insulating film 58 accompanying the etching of the silicon oxide film 60 can be suppressed to be as small as 20 nm.

Thus, the total etching amount of the device isolation insulating film 58 in removing the silicon oxide films 52, 60 can be suppressed to be as small as about 10 nm in the high voltage transistor forming regions 32, 40 and about 30 nm in the low voltage transistor forming regions 16, 24.

Then, by, e.g., asking method, the photoresist film 62 is removed.

Next, by thermal oxidation method, a silicon oxide film 64 of, e.g., a 2 nm-thickness is formed. As the processing conditions, for example, the temperature is set at 810° C., and the processing period of time is set at 8 seconds.

Next, thermal processing of, e.g., 870° C. and 13 seconds is made in NO atmosphere to introduce nitrogen into the silicon oxide films 60, 64.

Figure 15:
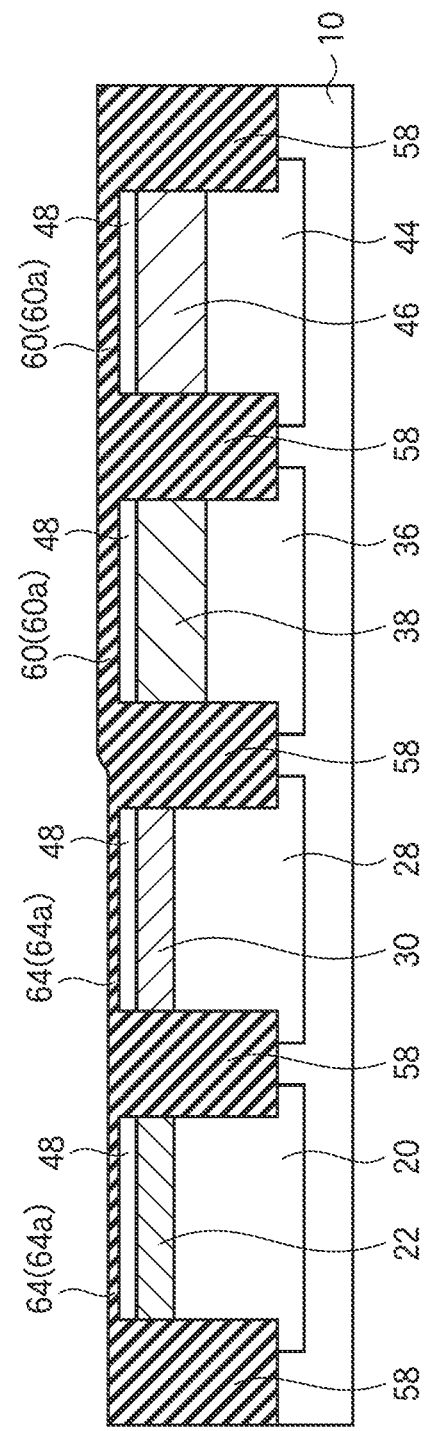

Thus, the gate insulating films 60*a* of the silicon oxide film 60 are formed in the high voltage NMOS transistor forming region 32 and the high voltage PMOS transistor forming region 40. In the low voltage NMOS transistors forming region 16 and the low voltage PMOS transistors forming region 24, the gate insulating films 64*a* of the silicon oxide film 64 thinner than the silicon oxide film 60 are formed (FIG. 15).

Then, above the entire surface, a non-doped polycrystalline silicon film of, e.g., a 100 nm-thickness is deposited by, e.g., LPCVD method. As the processing conditions, for example, the temperature is set at 605° C.

Figure 16:
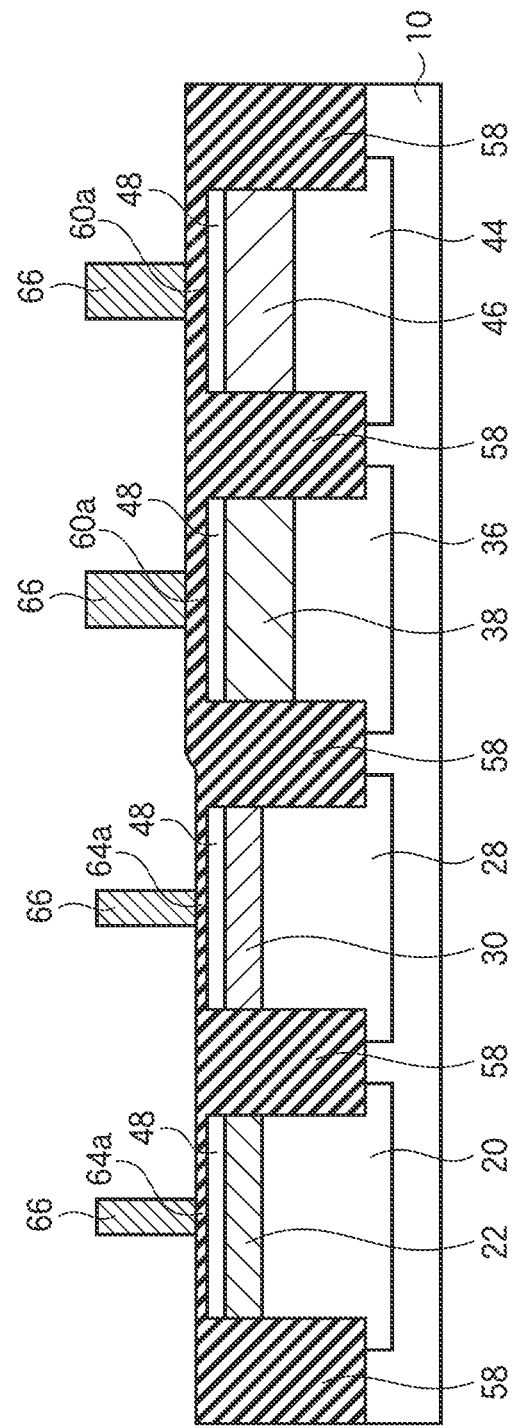

Next, by photolithography and dry etching, the polycrystalline silicon film is patterned to form the gate electrodes 66 in the respective transistor forming regions (FIG. 16).

Next, by photolithography and ion implantation, n-type impurity ions are implanted selectively in the high voltage NMOS transistor forming region 32 with the gate electrode 66 as the mask to form n-type impurity layers 68 to be the LDD regions. The n-type impurity layers 68 are formed by implanting, e.g., phosphorus ions under the conditions of 35 keV acceleration energy and $2\times10^{13}$ cm$^{-2}$ dose.

Next, by photolithography and ion implantation, p-type impurity ions are implanted selectively in the high voltage PMOS transistor forming region 40 with the gate electrode 66 as the mask to form p-type impurity layers 70 to be the LDD regions. The p-type impurity layers 70 are formed by implanting, e.g., boron ions under the conditions of 10 keV acceleration energy and $2\times10^{13}$ cm$^{-2}$ dose.

Next, by photolithography and ion implantation, n-type impurity ions are implanted selectively in the low voltage NMOS transistor forming region 16 with the gate electrode 66 as the mask to form n-type impurity layers to be the extension regions. The n-type impurity layers 72 are formed by implanting, e.g., arsenic ions at 6 keV acceleration energy and $2\times10^{14}$ cm$^{-2}$ dose.

Figure 17:
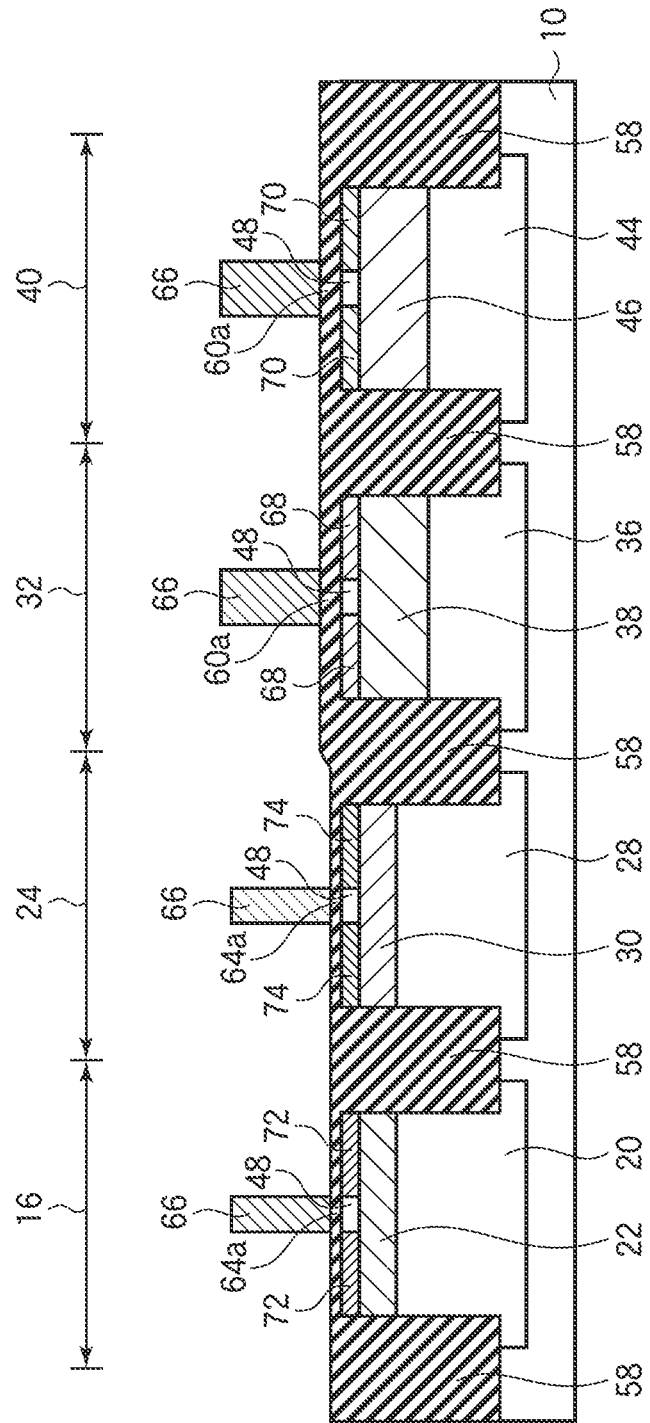

Then, by photolithography and ion implantation, p-type impurity ions are implanted selectively in the low voltage PMOS transistor forming region 24 with the gate electrode 66 as the mask to form p-type impurity layers to be the extension regions (FIG. 17). The p-type impurity layers 74 are formed by implanting, e.g., boron ions at 0.6 keV acceleration energy and $7\times10^{14}$ cm$^{-2}$ dose.

Then, above the entire surface, a silicon oxide film of, e.g., an 80 nm-thickness is deposited by, e.g., CVD method. As the processing condition, for example, the temperature is set at 520° C.

Figure 18:
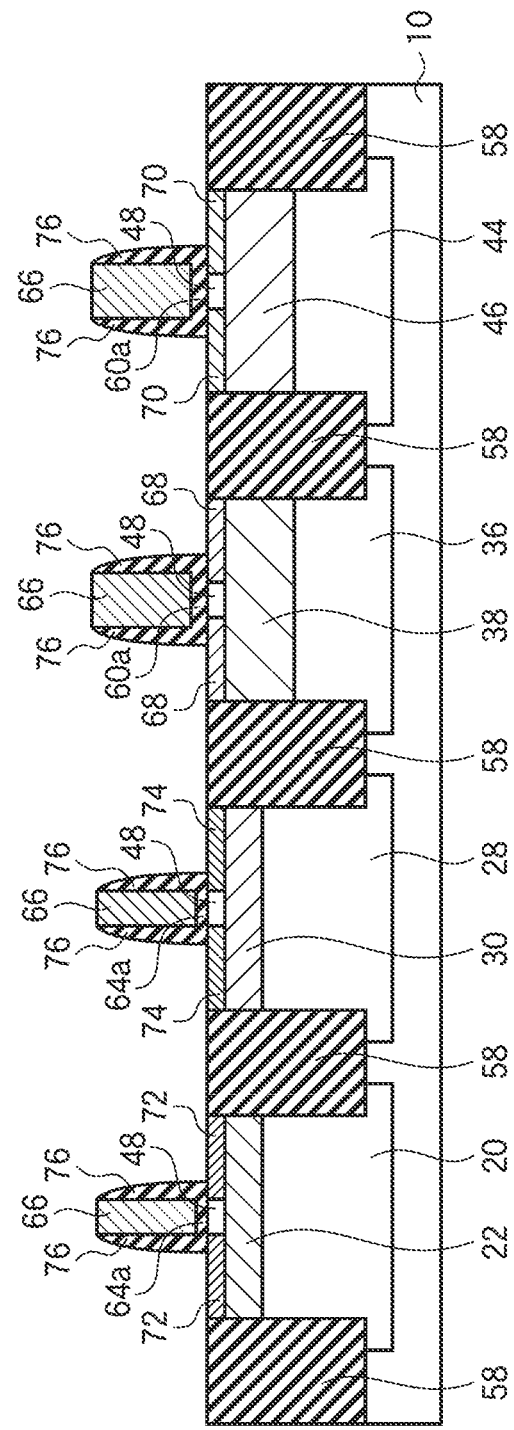

Next, the silicon oxide film deposited above the entire surface is anisotropically etched to be left selectively on the side walls of the gate electrodes 66. Thus, the sidewall spacers 76 of the silicon oxide film are formed (FIG. 18).

Next, by photolithography and ion implantation, ion implantation is made selectively in the low voltage NMOS transistor forming region 16 and the high voltage NMOS transistor forming region 32 with the gate electrodes 66 and the sidewall spacers 76 as the mask. Thus, the n-type impurity layers 78 to be the source/drain regions are formed, and n-type impurities are doped to the gate electrodes 66 of the NMOS transistors. As the conditions for the ion implantation, for example, phosphorus ions are implanted at 8 keV acceleration energy and at $1.2\times10^{16}$ cm$^{-2}$ dose.

Next, by photolithography and ion implantation, ion implantation is made selectively in the low voltage PMOS transistor forming region 24 and the high voltage PMOS transistor forming region 40 with the gate electrodes 66 and the sidewall spacers 76 as the mask. Thus, the p-type impurity layers 80 to be the source/drain regions are formed, and p-type impurities are doped to the gate electrodes 66 of the PMOS transistors. As the conditions for the ion implantation, for example, boron ions are ion implanted at 4 keV acceleration energy and $6\times10^{15}$ cm$^{-2}$ dose.

Then, rapid thermal processing of, e.g., 1025° C. and 0 second is made in an inert gas ambient atmosphere to activate the implanted impurities and diffuse the impurities in the gate electrodes 66. The thermal processing of 1025° C. and 0 second is sufficient to diffuse the impurities to the interfaces between the gate electrodes 66 and the gate insulating films.

The channel portions of the low voltage NMOS transistor can retain steep impurity distributions by carbon suppressing the diffusion of boron, and the channel portions of the low voltage PMOS transistor can retain steep impurity distributions by the slow diffusion of arsenic or antimony. On the other hand, the channel portion of the high voltage NMOS transistor, in which no carbon is implanted, the diffusion is not suppressed, and the channel portion of the high voltage PMOS transistor, in which phosphorus, whose diffusion constant is larger than arsenic or antimony, can have gradual impurity distribution.

Figure 19:
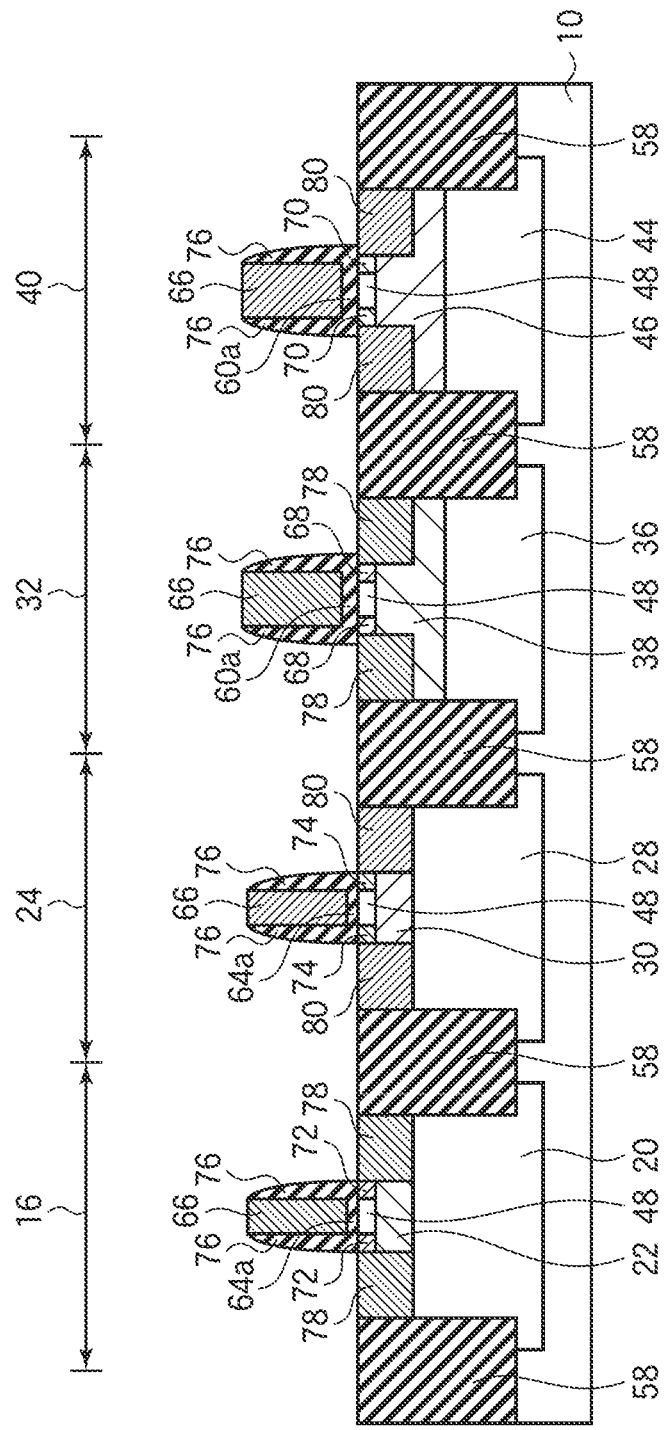

Thus, the 4 kinds of the transistors are completed on the silicon substrate 10. That is, in the low-voltage NMOS transistor forming region 16, the low-voltage NMOS transistor (LV NMOS) is formed. In the low-voltage PMOS transistor forming region 24, the low-voltage PMOS transistor (LV PMOS) is formed. In the high voltage NMOS transistor forming region, the high voltage NMOS transistor (HV NMOS) is formed. In the high voltage PMOS transistor forming region, the high voltage PMOS transistor (HV PMOS) is formed (FIG. 19).

Then, by salicide (self-aligned silicide) process, a metal silicide film 84 of, e.g., a cobalt silicide film is formed on the gate electrodes 66, the n-type impurity layers 78 and the p-type impurity layers 80.

Next, above the entire surface, a silicon nitride film of, e.g., a 50 nm-thickness is deposited by, e.g., CVD method to form the silicon nitride film as the etching stopper film.

Next, above the silicon nitride film, a silicon oxide film of, e.g., a 500 nm-thickness is deposited by, e.g., high density plasma CVD method.

Thus, the inter-layer insulating film 86 of the layer film of the silicon nitride film and the silicon oxide film is formed.

Next, the surface of the inter-layer insulating film 86 is polished by, e.g., CMP method to planarize.

Figure 20:
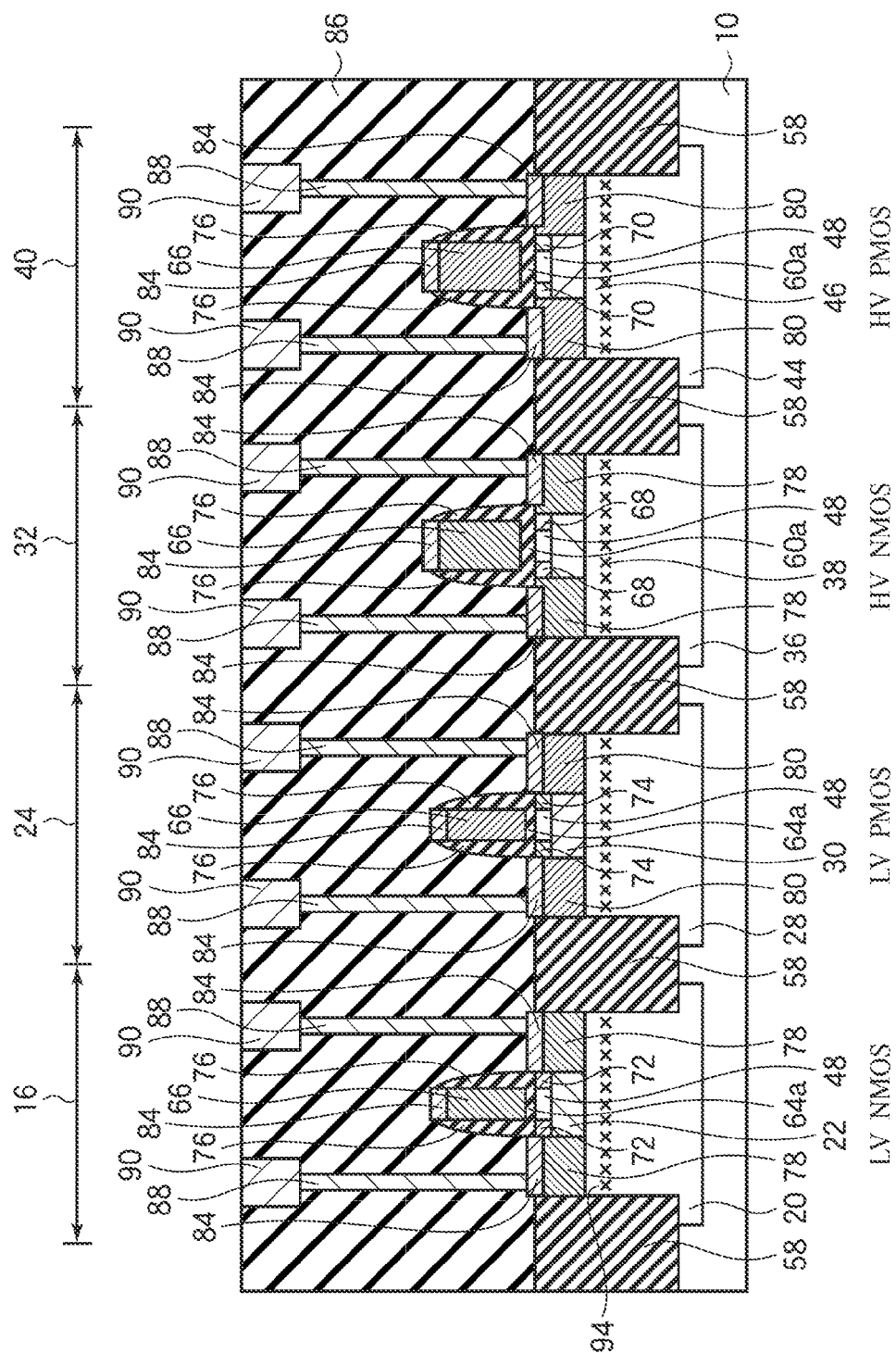

Then, the contact plugs 88 buried in the inter-layer insulating film 86, interconnections 90 connected to the contact plugs 88, and others are formed, and the semiconductor device is completed (FIG. 20).

As described above, according to the present embodiment, ion implantation is made in the entire surface of the silicon substrate without using a mask to make the surface region of the silicon substrate amorphous in advance, which makes it unnecessary to make ion implantation for the amorphization in forming the channel impurity layer of the low voltage NMOS transistor. This prevents the deformation of the photoresist film in forming the channel impurity layer of the low voltage NMOS transistor, and the photoresist film can be removed easily by a process, such as wet processing with a chemical liquid, which little damages the silicon substrate.

A Reference Example

A method of manufacturing a semiconductor device according to a reference example will be described with reference to FIGS. 21A to 26. The same members of the present reference example as those of the semiconductor device and the method of manufacturing the same according to the embodiment illustrated in FIGS. 1 to 20 are represented by the same reference numbers not to repeat or to simplify the description.

FIGS. 21A to 26 are sectional views illustrating the method of manufacturing the semiconductor device according to the present reference example.

First, photolithography and etching, the trench to be used as the mark for the mask alignment is formed in a region other than the product to be formed region of the silicon substrate 10.

Next, above the entire surface of the silicon substrate 10, the silicon oxide film 14 as the protection film for the surface of the silicon substrate 10 is formed (FIG. 21A).

Then, by photolithography and ion implantation, the p-well 20 and the p-type highly doped impurity layer 22 are formed in the low voltage NMOS transistor forming region 16 and the high voltage NMOS transistor forming region 32.

The p-well 20 and the p-type highly doped impurity layer 22 are formed, e.g., by ion implanting double boron or boron fluoride ($BF_2$).

Next, by photolithography and ion implantation, the n-well 28 and the n-type highly doped impurity layer 30 are formed in the low voltage PMOS transistor forming region 24 and the high voltage PMOS transistor forming region 40 (FIG. 21B). The n-well 28 and the n-type highly doped impurity layer 30 are formed, e.g., by ion implanting double phosphorus, arsenic or antimony (Sb).

Next, thermal processing is made to recover the ion implantation damage and activate the implanted impurities.

Next, by wet etching with hydrofluoric acid aqueous solution, the silicon oxide film 14 is removed.

Then, above the silicon substrate, the non-doped silicon layer 48 is epitaxially grown (FIG. 22A).

Next, by STI method, the device isolation insulating film 58 is formed in the silicon substrate 10 and the silicon layer 48 (FIG. 22B).

Figure 23A:
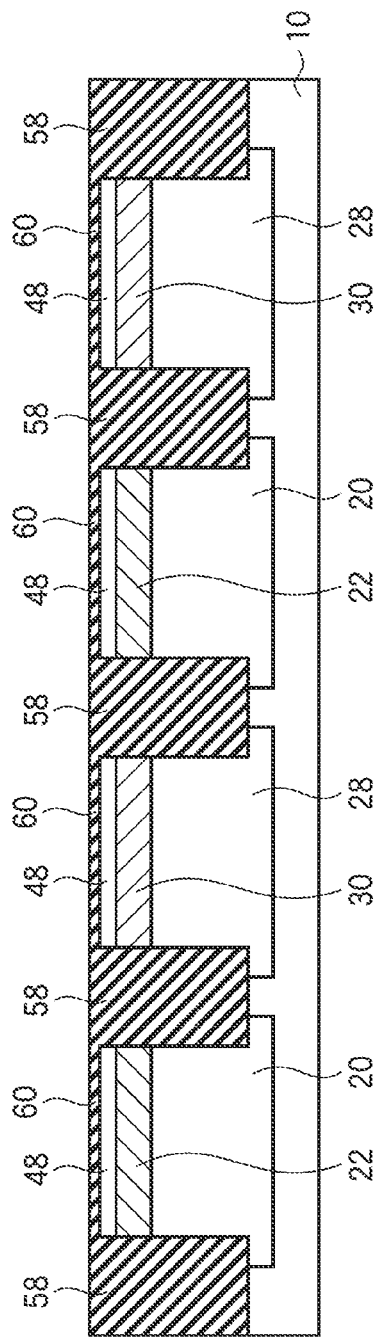

Next, above the active regions, the silicon oxide film 60 to be the gate insulating films 60a of the high voltage NMOS transistor and the high voltage PMOS transistors is formed (FIG. 23A).

Figure 23B:
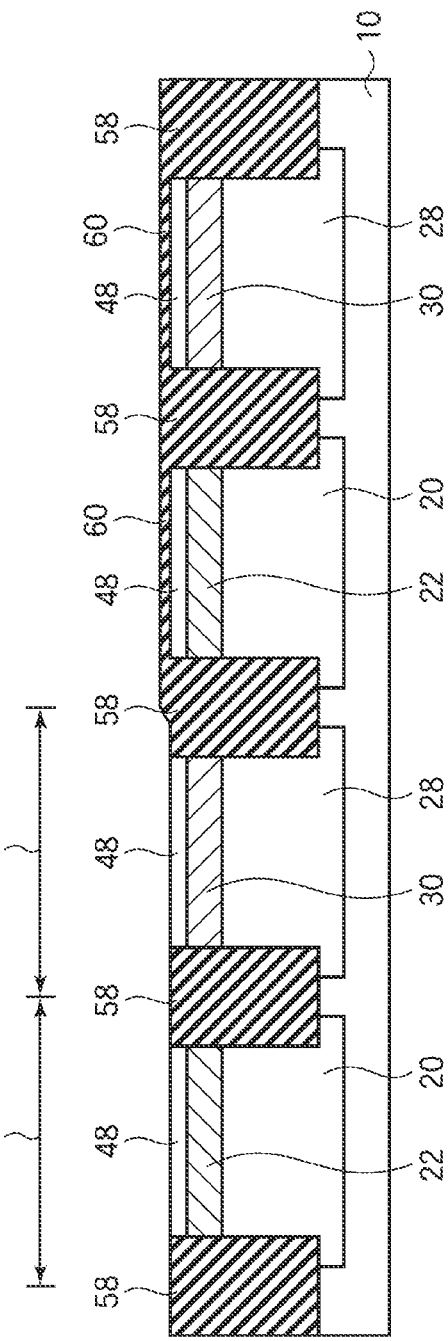

Then, by photolithography and wet etching, the silicon oxide film 60 in the low voltage NMOS transistor forming region 16 and the low voltage PMOS transistor forming region 24 is selectively removed (FIG. 23B).

Figure 24A:
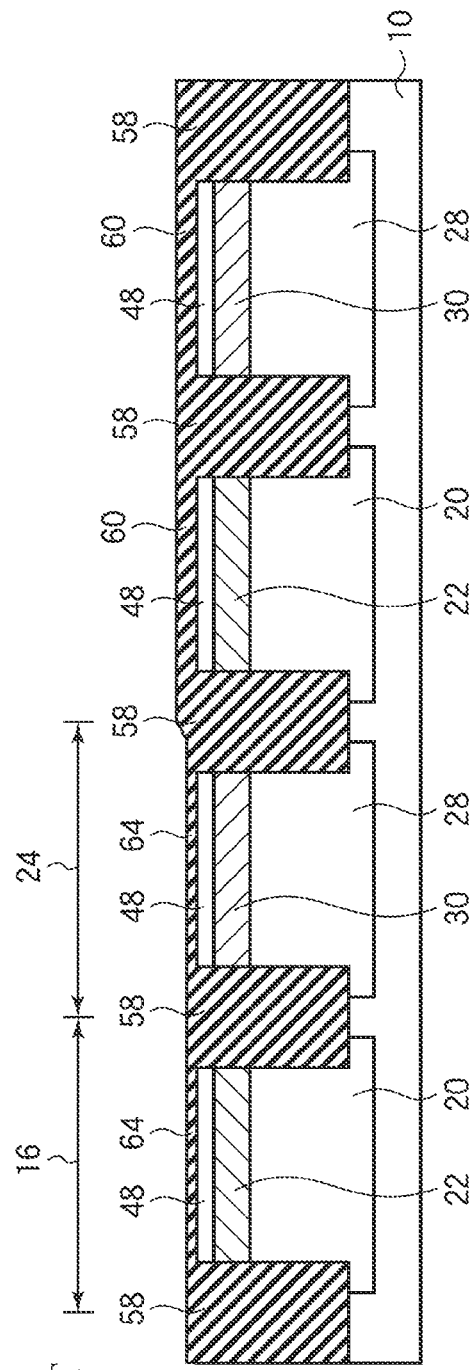

Next, above the active regions of the low voltage NMOS transistor forming region 16 and the low voltage PMOS transistor forming region 24, the silicon oxide film 64 to be the gate insulating films 64a is formed (FIG. 24A).

Then, above the entire surface, a polycrystalline silicon film 66a is formed.

Figure 24B:
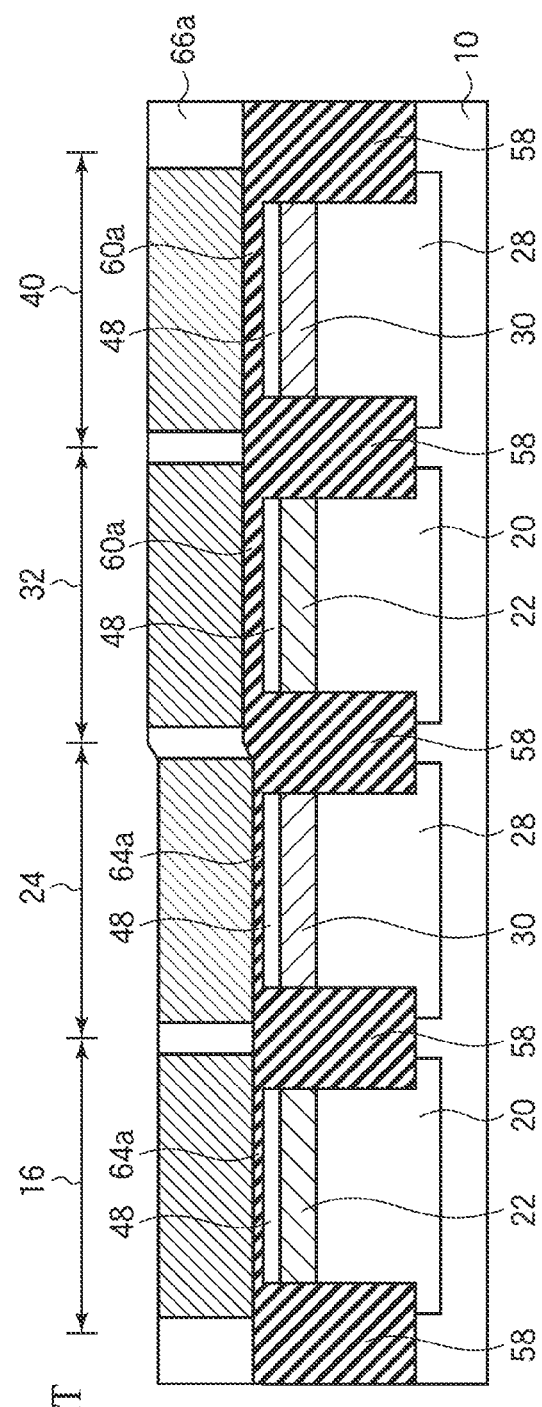

Next, by photolithography and ion implantation, an n-type impurity ions are implanted into the polycrystalline silicon film 66a in the low voltage NMOS transistor forming region 16 and the high voltage NMOS transistor forming region 32. Into the polycrystalline silicon film 66a in the low voltage PMOS transistor forming region 24 and the high voltage PMOS transistor forming 40, a p-type impurity ions are implanted (FIG. 24B).

Next, the polycrystalline silicon film 66a is patterned to form the gate electrodes 66 in the respective transistor forming regions.

Figure 25A:
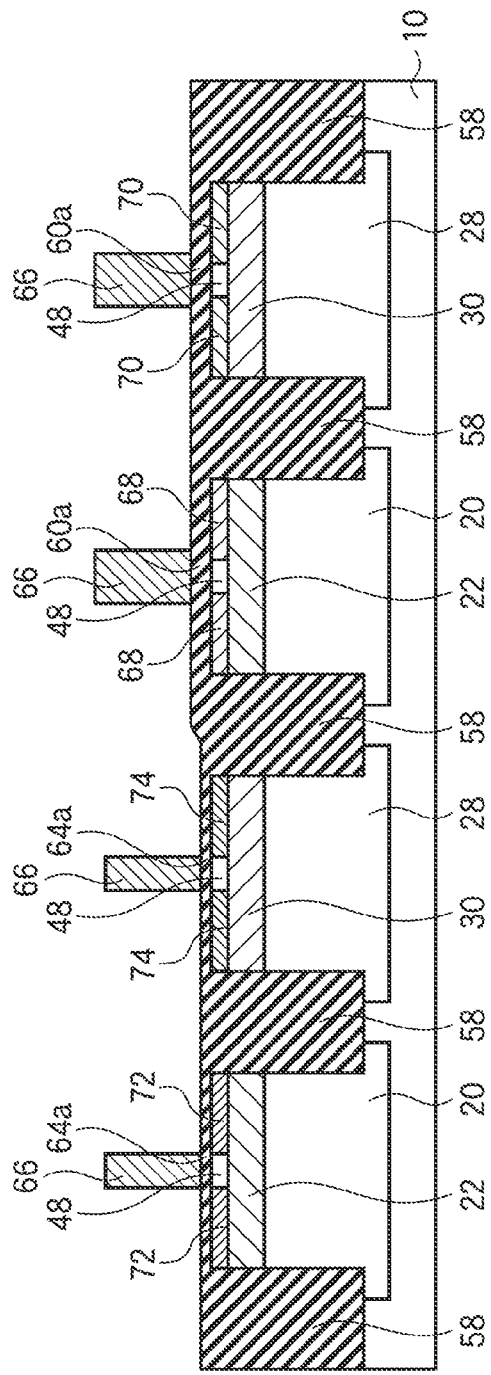

Next, by photolithography and ion implantation, n-type impurity layers 72 to be the extension regions are formed in the low voltage NMOS transistor forming region 16. In the low voltage PMOS transistor forming region 24, p-type impurity layers 74 to be the extension regions are formed. In the high voltage NMOS transistor forming region 32, n-type impurity layers 68 to be the LDD regions are formed. In the high voltage PMOS transistor forming region 40, p-type impurity layer 70 to be the LDD regions are formed (FIG. 25A).

Figure 25B:
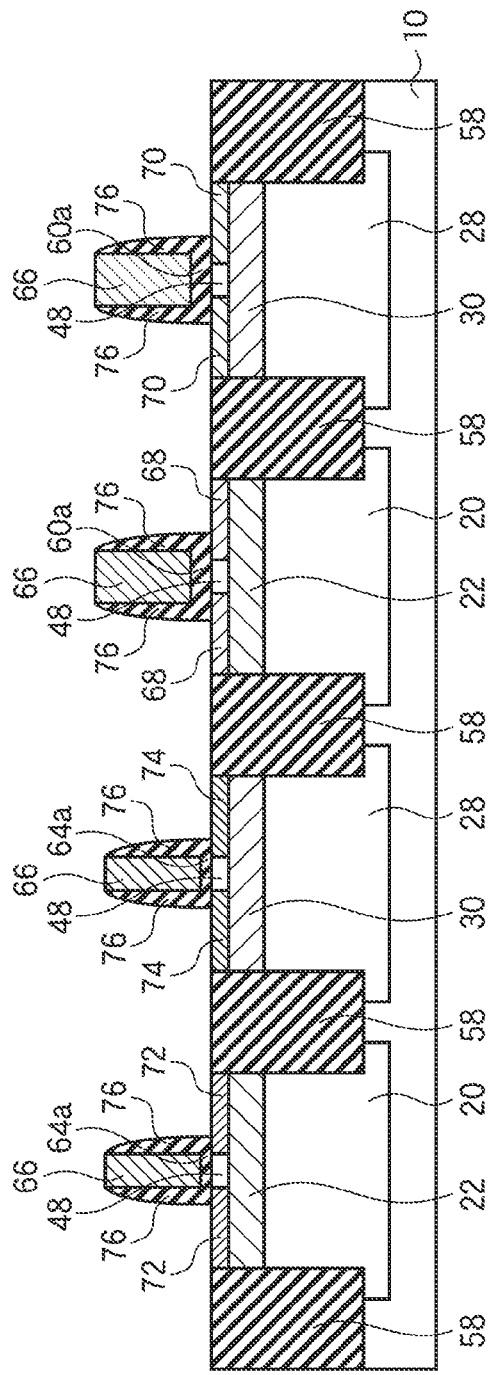

Next, a silicon oxide film is deposited and anisotropically etched to form the sidewall spacers 68 on the side walls of the gate electrodes 66 (FIG. 25B).

Figure 26:
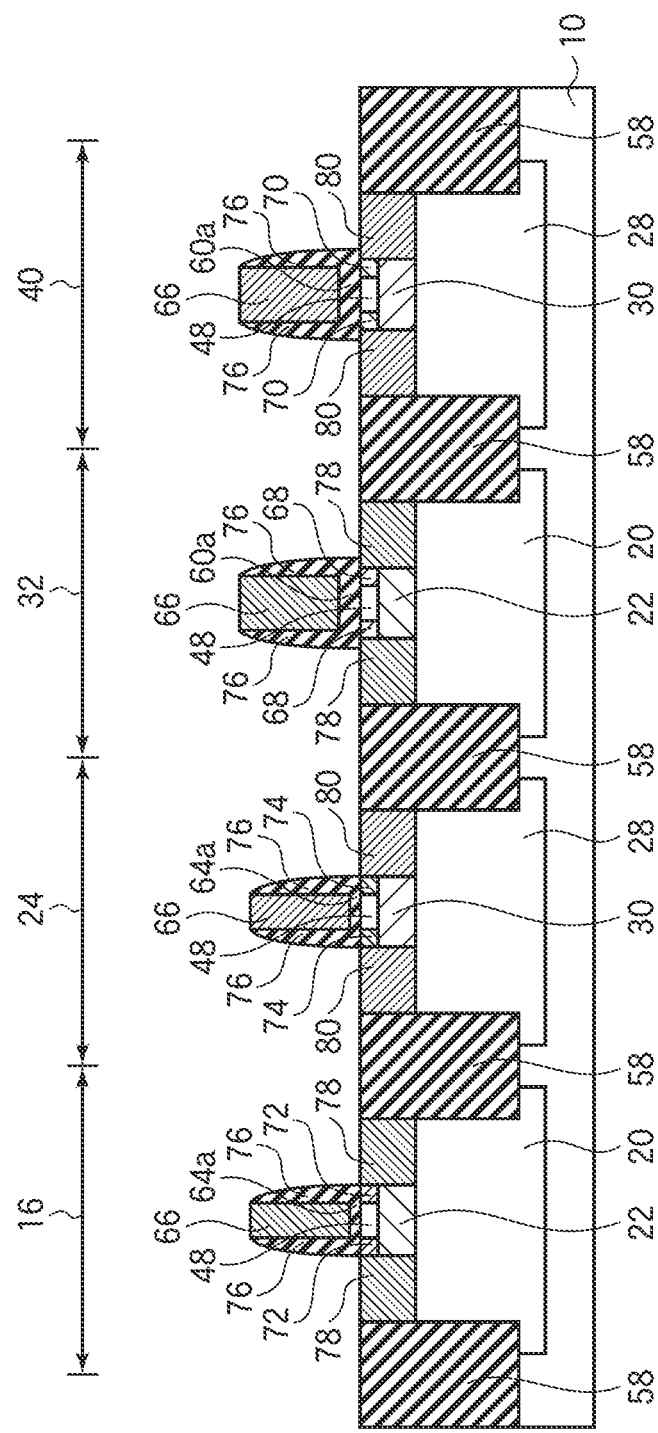

Next, by photolithography and ion implantation, n-type impurity layers 78 to be the source/drain regions are formed in the low voltage NMOS transistor forming region 16 and the high voltage NMOS transistor forming region 32. In the low voltage PMOS transistor forming region 24 and the high voltage PMOS transistor forming region 40, p-type impurity layers 80 to be the source/drain regions are formed (FIG. 26).

Next, thermal processing is made to activate the implanted impurities.

Thus, above the silicon substrate 10, the low voltage NMOS transistor, the low voltage PMOS transistor, the high voltage NMOS transistor and the high voltage PMOS transistor are formed.

In the present reference example, the highly doped impurity layer 22 of the low voltage NMOS transistor is formed of boron, and the boron diffuses, because of the high diffusion constant, toward the epitaxial layer in the later thermal processes, which is a cause for the fluctuations of the threshold voltage due to the statistical fluctuations of the impurities. To suppress the fluctuations of the threshold voltage due to the statistical fluctuations of the impurities, it is important to prevent the diffusion of boron in the highly doped impurity layer 22 into the epitaxial layer.

As means for preventing the diffusion of boron, carbon and boron are ion implanted after the surface of the silicon substrate has been made amorphous. This means can suppress the diffusion of boron and can increase the maximum quantity of the allowable thermal processing.

However, to make the silicon substrate amorphous, generally, a heavy atom, such as germanium or silicon, is heavily ion implanted. When a photoresist film exposing the NMOS transistor forming regions is formed, and with the photoresist film as the mask, ion implantation for the amorphization and the ion implantation of carbon and boron are made, the photoresist film is deformed due to the heavy ion implantation for the amorphization. The deformed photoresist film is difficult to be removed by wet etching with a chemical liquid, such as sulfuric acid-hydrogen peroxide mixture liquid.

The deformed photoresist is difficult to be removed by simple oxygen plasma processing and requires the means of, e.g., $CF_4/O_2$ plasma processing. However, the $CF_4/O_2$ plasma processing has disadvantages that the silicon substrate is also etched, and oxygen and carbon of high energy are implanted into the silicon substrate.

Modified Embodiments

The above-described embodiment can cover other various modifications.

For example, in the above-described embodiments, in forming the p-type highly doped impurity layer 22, germanium ions are implanted for the amorphization. The ion species to be used for the amorphization is not limited to this. For example, silicon, argon, xenon or others may be used.

In the above-described embodiment, as the base semiconductor substrate, a silicon substrate is used, but the base semiconductor substrate may not be essentially a bulk silicon substrate. Other semiconductor substrates, such as SOI substrate, etc., may be used.

In the above-described embodiment, as the epitaxially semiconductor layer, a silicon layer is used, but the silicon layer is not essential. In place of the silicon layer, other semiconductor layers, such as SiGe layer, SiC layer, etc., may be used.

The structure, the constituent material, the manufacturing conditions, etc. of the semiconductor device described in the embodiment described above are one example and can be changed or modified suitably in accordance with the technical common sense, etc. of those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A method of manufacturing a semiconductor device comprising:
    amorphizing a first region and a second region of a semiconductor substrate by an ion implantation into the semiconductor substrate;
    ion implanting a first impurity of a first conduction type in the first region of the semiconductor substrate;
    ion implanting a second impurity of a second conduction type in the second region of the semiconductor substrate;
    activating the first impurity and the second impurity to form a first impurity layer in the first region and a second impurity layer in the second region;
    epitaxially growing a semiconductor layer above the semiconductor substrate with the first impurity layer and the second impurity layer formed in;
    forming a gate insulating film above the semiconductor layer in the first region and the second region; and
    forming a first gate electrode above the first gate insulating film in the first region and a second gate electrode above the first gate insulating film in the second region.

2. The method of manufacturing a semiconductor device according to claim 1, wherein
    in amorphizing the semiconductor substrate, the ion implantation is made without using a mask.

3. The method of manufacturing a semiconductor device according to claim 1, wherein
    in amorphizing the semiconductor substrate, germanium ions or silicon ions are implanted into the semiconductor substrate.

4. The method of manufacturing a semiconductor device according to claim 1, further comprising after forming the first gate electrode and the second gate electrode:
    forming first source/drain regions of the second conduction type in the semiconductor layer and the semiconductor substrate in the first region; and
    forming second source/drain regions of the first conduction type in the semiconductor layer and the semiconductor substrate in the second region, wherein
    in amorphizing the semiconductor substrate, the semiconductor substrate is so amorphized that an amorphous layer to be formed in the semiconductor substrate is deeper than the first source/drain regions and the second source/drain regions.

5. The method of manufacturing a semiconductor device according to claim 1, wherein
    the first impurity contains boron and carbon.

6. The method of manufacturing a semiconductor device according to claim 1, wherein
    the second impurity contains arsenic or antimony.

7. The method of manufacturing a semiconductor device according to claim 1, further comprising after forming the semiconductor layer:
    forming a device isolation insulating film in the semiconductor substrate with the semiconductor layer formed on.

8. A method of manufacturing a semiconductor device comprising:
    amorphizing a first region, a second region, a third region and a fourth region of a semiconductor substrate by an ion implantation into the semiconductor substrate;
    ion implanting a first impurity of a first conduction type in the first region of the semiconductor substrate;
    ion implanting a second impurity of a second conduction type in the second region of the semiconductor substrate;
    ion implanting a third impurity of the first conduction type in the third region of the semiconductor substrate;
    ion implanting a fourth impurity of the second conduction type in the fourth region of the semiconductor substrate;
    activating the first impurity, the second impurity, the third impurity and the fourth impurity to form a first impurity layer in the first region, a second impurity layer in the second region, a third impurity layer in the third region and a fourth impurity layer in the fourth region;
    epitaxially growing a semiconductor layer above the semiconductor substrate with the first impurity layer, the second impurity layer, the third impurity layer and the fourth impurity layer formed in;
    forming a first gate insulating film above the semiconductor layer in the first region, the second region, the third region and the fourth region;
    removing the first gate insulating film in the first region and the second region;
    forming a second gate insulating film thinner than the first gate insulating film above the semiconductor layer in the first region and the second region; and
    forming a first gate electrode above the second gate insulating film in the first region, a second gate electrode above the second gate insulating film in the second region, a third gate electrode above the first gate insulating film in the third region and a fourth gate electrode above the first gate insulating film in the fourth region.

9. The method of manufacturing a semiconductor device according to claim 8, wherein
    in amorphizing the semiconductor substrate, the ion implantation is made without using a mask.

10. The method of manufacturing a semiconductor device according to claim 8, wherein
    in amorphizing the semiconductor substrate, germanium ions or silicon ions are implanted into the semiconductor substrate.

11. The method of manufacturing a semiconductor device according to claim 8, further comprising after forming the first gate electrode, the second gate electrode, the third gate electrode and the fourth gate electrode:
    forming first source/drain regions of the second conduction type in the semiconductor layer and the semiconductor substrate in the first region; and
    forming second source/drain regions of the first conduction type in the semiconductor layer and the semiconductor substrate in the second region, wherein
    in amorphizing the semiconductor substrate, the semiconductor substrate is so amorphized that an amorphous layer to be formed in the semiconductor substrate is deeper than the first source/drain regions and the second source/drain regions.

12. The method of manufacturing a semiconductor device according to claim 8, wherein
    the first impurity contains boron and carbon.

13. The method of manufacturing a semiconductor device according to claim 8, wherein
    the second impurity contains arsenic or antimony.

14. The method of manufacturing a semiconductor device according to claim 8, further comprising after forming the semiconductor layer:

forming a device isolation insulating film in the semiconductor substrate with the semiconductor layer formed on.

* * * * *